(12) United States Patent
Zantl

(10) Patent No.: US 12,448,598 B2
(45) Date of Patent: Oct. 21, 2025

(54) SUBSTRATE FOR TESTING SAMPLES AND SYSTEM COMPRISING THE SAME

(71) Applicant: ibidi GmbH, Gräfelfing (DE)

(72) Inventor: Roman Zantl, Gräfelfing (DE)

(73) Assignee: ibidi GmbH, Gräfelfing (DE)

( * ) Notice: Subject to any disclaimer, the term of this patent is extended or adjusted under 35 U.S.C. 154(b) by 824 days.

(21) Appl. No.: 17/662,714

(22) Filed: May 10, 2022

(65) Prior Publication Data

US 2022/0364035 A1   Nov. 17, 2022

(51) Int. Cl.
*C12M 1/00* (2006.01)
*B01L 3/00* (2006.01)

(52) U.S. Cl.
CPC ....... *C12M 29/10* (2013.01); *B01L 3/502738* (2013.01); *C12M 23/34* (2013.01); *C12M 23/40* (2013.01); *B01L 2200/141* (2013.01); *B01L 2300/088* (2013.01); *B01L 2300/14* (2013.01); *B01L 2400/0633* (2013.01)

(58) Field of Classification Search
CPC ...... C12M 29/10; C12M 23/40; C12M 23/34; C12M 23/16; B01L 3/502738; B01L 3/502715; B01L 2300/088; B01L 2300/14042; B01L 2300/06891; B01L 2300/0816; B01L 2300/0829; B01L 2300/0851; B01L 2300/0854; B01L 2300/0864; B01L 2300/0867; B01L 2300/087; B01L 2200/0674; B01L 2200/0869; B01L 2400/0481; B01L 2400/0487; B01L 2400/0611; B01L 2400/0616; B01L 2400/0638; F16K 11/087; F16K 99/0005; F16K 99/0057; F16K 2099/0084

See application file for complete search history.

(56) References Cited

U.S. PATENT DOCUMENTS

| 7,934,519 | B2 | 5/2011 | Zantl | |
|---|---|---|---|---|
| 8,215,338 | B2 | 7/2012 | Delattre | |
| 2010/0261193 | A1* | 10/2010 | Webster | B01L 3/502738 137/511 |
| 2020/0038864 | A1* | 2/2020 | Ball | B01L 3/50273 |

FOREIGN PATENT DOCUMENTS

| EP | 1941947 A1 | 7/2008 |
|---|---|---|
| WO | 2011006671 A1 | 1/2011 |

OTHER PUBLICATIONS

European Search Report, European Patent Application No. 21173579.0, Oct. 29, 2021.

* cited by examiner

*Primary Examiner* — Michael L Hobbs
(74) *Attorney, Agent, or Firm* — Lowenstein Sandler LLP

(57) ABSTRACT

The invention relates to a substrate for testing samples, in particular cells or molecules, wherein the substrate comprises a fluid system comprising a sample chamber configured in the substrate for storing and testing samples and at least one liquid reservoir in fluid communication with the sample chamber, and wherein the substrate comprises a passive blocking element capable of assuming a closed position and an open position, wherein in the closed position a fluid exchange between the sample chamber and the liquid reservoir is blocked.

18 Claims, 9 Drawing Sheets

SUBSTRATE FOR TESTING SAMPLES AND SYSTEM COMPRISING THE SAME

RELATED APPLICATIONS

This patent application claims the benefit of European Application No. 21173579.0, filed May 12, 2021.

FIELD OF INVENTION

The invention relates to a substrate for testing samples, in particular cells or molecules, and system comprising the same. The invention also relates to a method of using the substrate or system.

BACKGROUND

When testing samples, especially for the examination of cells or observation of chemical reactions, an important application is to enable liquids, such as process liquids or cleaning liquids, to flow around or over the sample. For this purpose, the liquids in the substrate are transported through a fluid system including the sample chamber. Frequently, through the fluid system, there are moving in particular a plurality of liquids one after the other.

Known systems typically comprise a plurality of liquid reservoirs disposed outside the substrate, said liquid reservoirs being connected to the substrate. The reservoirs may be connected to the substrate via a suitable combination of connections and valves. The liquids are typically moved by pumps.

If a variety of liquids is to be transported one after the other through the sample chamber, there exists a risk of mixing of the liquids in the sample chamber unless there is always a complete exchange of all the liquid in the substrate, so a lot of liquid and therefore relatively large liquid reservoirs are required.

SUMMARY

In an example implementation, a substrate for testing samples, in particular cells or molecules, is provided. The substrate comprises a fluid system comprising a sample chamber configured in the substrate for storing and testing samples and at least one liquid reservoir in fluid communication with the sample chamber. The substrate further comprises at least one passive blocking element that can assume a closed position and an open position, wherein in the blocking position a fluid exchange between the sample chamber and the liquid container is blocked.

BRIEF DESCRIPTION OF THE DRAWINGS

Further features and advantages will be described below with reference to the exemplary figures, wherein.

DETAILED DESCRIPTION

Figure 1A:
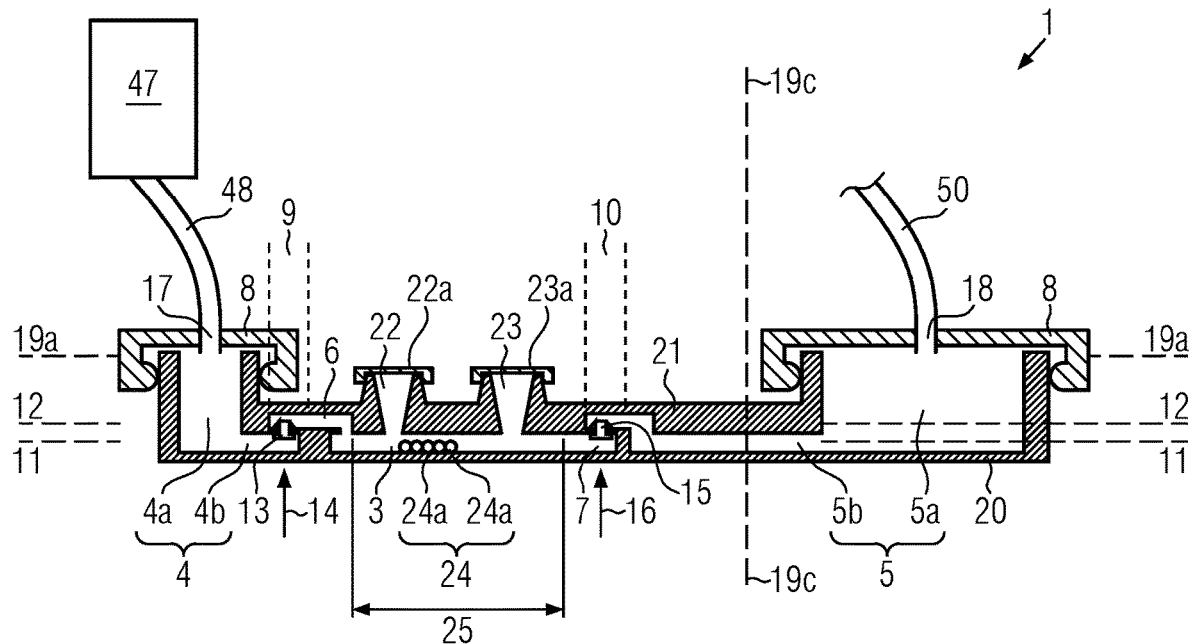
FIGS. 1a and 1b show a schematic not to scale top view and cross-section view of a substrate of a first embodiment.

It is an object of the invention to provide a substrate that allows for a more compact experimental setup with little risk of mixing liquids in the sample chamber.

The object is achieved by the subject matter of claim 1. Accordingly, the substrate comprises a fluid system comprising a sample chamber configured in the substrate for storing and testing samples, in particular cells or molecules, and at least one liquid container in fluid communication with the sample chamber, and a passive blocking element capable of assuming a closed position and an open position, wherein in the closed position liquid exchange between the sample chamber and the liquid container is blocked.

In other words, the passive blocking element is configured to establish and disconnect a fluid connection. Assuming the closed position is also referred to as closing and assuming the open position is also referred to as opening. In the open position, liquid exchange can occur between the sample chamber and the liquid container, for example, liquid can be transported from the sample chamber to the liquid container or from the liquid container to the sample chamber. The transport direction can be adjusted, for example, by means of a pressure applied to the fluid system.

On the one hand, the passive blocking element enables reliable separation of certain liquids present in the fluid system, but on the other hand, at appropriate application, it also enables liquid to be selectively exchanged between different regions of the fluid system, for example, to be transported from the sample chamber into a liquid container or from a liquid container into the sample chamber. Therefore, it is possible to store process liquids in the substrate until the time they are to be used, and also at any given time what needs to be replaced is only a small amount of liquid, rather than all of the liquid stored in the substrate. The external liquid container and associated pumps and valves can then be dispensed with.

The passive blocking element enables high reliability, a compact design and low material costs for the substrate. The latter is particularly advantageous for substrates that are intended to be disposable.

The passive blocking element may comprise a passive valve, in particular be a passive valve.

A passive blocking element being involved can particularly mean that the blocking element is configured in such a way that no active actuation, in particular no direct active actuation, is required on the blocking element for opening and closing the blocking element, i.e. for the transition from an open position to a closed position and for the transition from a closed position to an open position, for example no actuation, particularly direct actuation, by means of an electric or pneumatic drive.

Unless otherwise specified, all indications in the following, in particular those referring directly or indirectly to the spatial arrangement of the substrate or the system, for example "top", "above", "below", "on a level with", "top view" or "cross-sectional view", refer to the arrangement of the substrate in the intended use.

The fact that partial areas of the fluid system are in fluid communication means that they are directly or indirectly in fluid communication with each other. If partial areas are indirectly in fluid communication with each other, they can, for example, be in fluid communication with each other via other partial areas of the fluid system. In particular, they can be in fluid communication via the sample chamber. If partial areas are directly in fluid communication, in particular no other partial areas of the fluid system are arranged between them. Nevertheless, direct fluid communication does not preclude one of the blocking elements from being arranged between the directly fluidly connected partial areas.

The fluid system may comprise one or more chambers and/or one or more channels, each configured to store and/or transport liquid and remaining in direct or indirect fluid communication with the sample chamber. The fluid system may be configured entirely in the substrate or have partial areas configured in the substrate and partial areas arranged in receptacles in the substrate. Such partial areas can, for example, be in the form of elements such as tubes or bags.

The fluid system may have regions in which the floor and/or walls have surface functionalization, for example, planar surface functionalization or structured surface functionalization, in particular microstructured surface functionalization. Alternatively or additionally, the fluid system may have regions where the bottom is structured.

In particular, the fluid system may comprise a plurality of fluid channels, wherein fluid channels branch and/or fluid channels join. Fluid channels can, for example, have a rectangular cross-section, in particular with a width of 0.3 mm to 40 mm and/or a length of 3 mm to 120 mm. The channel can have a height from 0.04 mm to 10 mm.

The fluid system can be configured as a purely circular fluid system or as a circular fluid system with fluid exchange. A circular fluid system is configured in such a way that, in the intended use, the liquid is repeatedly guided through at least one fluidic structure of the fluid system, as typically is the case in a circuit. This may involve, for example, a closed loop system, or a system with liquid reservoirs that, in the intended use, can alternately receive and dispense liquids, for example, with the liquid being guided so that it repeatedly flows through the same fluidic structures.

In its intended use, the sample chamber serves as a testing chamber or observation chamber, for example for microscopic testing, which can be performed in particular from below through the bottom of the sample chamber. Cells can be introduced into the sample chamber and tested microscopically. Alternatively or additionally, chemical reactions can be observed in the sample chamber, visualized for example by means of fluorescent probes, for example by binding the probes to a surface of immobilized chemical groups. The sample chamber can also be configured for storing the samples, in particular it can be configured to be insulated from the environment.

The sample chamber can have an opening that is closed in the intended use and is configured in such a way that a sample can be introduced directly into the sample chamber from the outside. In particular, the opening may be arranged on the top of the substrate immediately above the sample chamber. In the intended use, it can be closed, for example, by a stopper, a plastic plate or a glass plate, wherein the plate can be fixed in particular by means of double-sided adhesive tape.

The substrate may comprise a porous membrane horizontally arranged within the sample chamber, dividing the sample chamber into lower and upper regions.

The substrate may comprise structures arranged in the sample chamber and configured for three-dimensional cultivation of cells, in particular hydrogel structures or other 3D cell culture scaffolds, for example made of porous materials. The structures can only partially fill the sample chamber, leaving regions in the sample chamber free for fluid to flow along the hydrogel structure. In particular, the sample chamber may have at least two such regions separated by the hydrogel structure. In particular, the substrate may comprise hydrogel arranged in the sample chamber and having binding sites for cells or molecules.

The sample chamber can have the shape of a cuboid. The sample chamber may have one or more little pots shaped in such a way that their shape allows spheroids or organoids to be held. The substrate may configured in the form of a multititer plate.

The substrate may comprise two plates, for example of glass or plastic, joined together, in particular in a liquid-tight manner. Both plates can be injection molded parts, or one of the plates can be a deep drawn sheet and the other a flat sheet, or one plate can be injection molded part and the other panel a flat or deep drawn sheet. The bottom plate may have a thickness between 0.2 µm and 10 mm. The plates can have the same width and length. The bottom plate and cover plate may be irreversibly connected to each other, particularly glued, ultrasonically bonded, or bonded via heat or a solvent.

The substrate may be made of glass or of a plastic, particularly a biocompatible plastic. The plastic material may comprise for example polycarbonate, polystyrene, polyethylene, polyvinyl chloride, cyclo-olefin copolymer, cyclo-olefin polymer or polymethyl methacrylate.

At least part of the substrate, particularly the bottom of the sample chamber, can be made of material formed in such a way that microscopic inspection of the sample chamber is possible, in particular through the bottom of the sample chamber. In particular, the birefringence of the material may be low enough to allow microscopic inspection, and/or the fluorescence of the material may be low enough to allow inspection with fluorescence microscopy. In particular, the refractive index of the material may be between 1.2 and 1.6.

The liquid container may be configured entirely or partially in the substrate, as specified hereinabove. Alternatively, at least a partial area of the liquid container may be arranged in a receiver in the substrate, such as a recess. The liquid container may comprise a plurality of partial areas, and all or only some of the partial areas may be configured in the substrate, or none of the partial areas may be configured in the substrate.

The liquid container comprises at least one partial area which is configured and, in the intended use, arranged in such a way that liquid can be stored and/or transported therein.

The liquid container may comprise at least one chamber and/or at least one fluid channel. The fluid channel and/or chamber may be configured in the substrate. Alternatively, for example, the fluid channel may be configured in the substrate and the chamber may be in the form of a container, for example a bag, arranged in a receiver, for example a recess, in the substrate. In this case, the container can be connected to the fluid channel, in particular inserted, cast in, welded in or glued in at its mouth.

The liquid container may comprise a chamber configured in the substrate and a fluid channel that opens into the chamber at the bottom of the chamber. For example, the fluid channel may open into the chamber through an opening in the bottom of the chamber or in the side wall of the chamber. The chamber may taper downward, particularly toward the opening. The chamber can have the shape of a funnel.

In the intended use, the liquid container can serve to store flushing liquids and/or process liquids, in particular fresh or not yet used process liquids, and/or as a collection reservoir for used liquids or waste. The liquid container can have various functions in the intended use, particularly it can be filled and/or emptied several times. In particular, a liquid container may serve to store a fresh flushing liquid or process liquid in the intended use and serve as a waste reservoir after the fresh flushing liquid or process liquid is removed from the liquid container.

The substrate may be configured in such a way that at least a partial area of the liquid container is configured for storing and testing samples, in particular cells or molecules. The liquid container can then serve in the intended use for storing and testing samples, i.e. as an additional sample chamber.

The blocking element has a closed position and an open position. The blocking element can be configured in such a way that it can be moved from a closed position to an open position and from an open position to a closed position. This means that the opening of the blocking element is reversible. Unlike pierceable membranes, for example, the blocking element and thus also the liquid container can be used several times.

The passive blocking element may be configured and arranged to enable the liquid to pass from the liquid container into the sample chamber and/or from the sample chamber into the liquid container in the open position. The blocking element can be configured in such a way that it has one or more directions of passage, particularly two opposite directions of passage.

When the terms "lock" or "prevent" are used here, it refers to the intended function of the blocking element. This means that the terms are to be understood within the meaning of usual system-related deviations, for example due to manufacturing tolerances.

The passive blocking element may comprise a passive pressure-dependent valve. The valve can, for example, be configured in such a way that it assumes a blocking position when the same pressure is applied on both sides of the valve. The valve can be configured in such a way that by applying pressure to one side of the valve, the valve is brought into a closed position and/or the closing effect of the valve is increased. Alternatively or additionally, the valve can be configured in such a way that the valve assumes an open position by applying pressure on the other side of the valve.

In particular, the blocking element may comprise a check valve, such as an umbrella valve or a duckbill valve or a ball check valve. A check valve opens in one direction only. Alternatively, the blocking element may comprise a valve that opens in both directions, such as a cross-slit valve or an X-fragm valve. The blocking element may also comprise a combination of valves.

An umbrella valve has the advantage of a low installation depth and is therefore particularly suitable for compact substrates, especially with a low substrate thickness.

The substrate can be configured and the blocking element can be configured and arranged in such a way that dead volumes, particularly upstream and downstream of the blocking element, are avoided.

The passive blocking element can be configured in such a way that it assumes the closed position or the open position depending on the pressure conditions in the fluid system.

In particular, the blocking element can assume a closed position or an open position depending on the relative pressure on the two sides of the blocking element. The blocking element assuming the closed position or the open position entails that said blocking element remains in the closed position or in the open position, i.e. remains closed or open, or that said blocking element changes from the closed position to the open position or from the open position to the closed position, i.e. opens or closes.

The pressure ratios can be adjusted in particular by applying pressure to the fluid system, as explained in detail below, for example by means of a pump system connected via suitable connections.

The substrate, in particular the fluid system and the blocking elements, can be configured in particular in such a way that the liquid transport in the substrate can be controlled solely by applying pressure to the fluid system.

The advantage of the blocking elements described hereinabove in the claimed substrate is that very simply by applying pressure to the fluid system, for example via a pump system, fluids can be selectively moved through the fluid system, while at the same time preventing fluids from mixing or entering regions of the fluid system when this is not intended. Since an external pump system is usually provided for driving the liquid anyway, it is sufficient to control it accordingly or, if necessary, to modify it. No active components, such as controllable valves or pumps, need to be provided in the substrate. This enables low manufacturing costs for the substrate and low error sensitivity. The latter results from the fact that active components typically have higher error sensitivity than passive components and that the complexity of control is also increased by each additional active component.

The substrate can be configured in such a way that no active components are arranged in the substrate, in particular no active valves and/or pumps. Active components are understood here as components that are directly adjusted and/or operated, for example by an electric or pneumatic drive. The absence of active components means, as explained above, that the manufacturing costs of the substrate and the error sensitivity are low.

The liquid container can be lockable in such a way that it has no direct connection to the outside, in particular it is completely closed to the outside. Alternatively or additionally, the sample chamber can be lockable in such a way that it has no direct connection to the outside, in particular it is completely closed to the outside. In particular the whole fluid system can be lockable in such a way that it has no direct connection to the outside, in particular it is completely closed to the outside.

In this respect, "completely closed to the outside" means that no direct gas exchange with the environment of the substrate can take place. This means, for example, that all openings, especially the connections, can be connected to a pump system or closed with a lid or plug. The fluid system can thus be sealed for the part of the process in which liquids are transported through the system to such an extent that the pressure conditions in the system can be completely specified by means of the connected pump system. It also helps to prevent contamination of the fluid system during use.

If the system is appropriately sealed to the outside, this can reduce the risk of contamination. Moreover, if the sealing is done after filling the liquids and sample intended for a process, the substrate can be transported in a ready for use state. Use of the substrate for complex processes involving transport of a plurality of liquids through the sample chamber while sealing to the outside is enabled by the fact that the system can be used in a fluidically self-contained manner. For this purpose, the samples and the required liquids can be filled into different regions of the fluid system, which are initially separated from each other by passive blocking elements, and then certain blocking elements can be successively opened and closed so that the liquids are transported within the substrate as is required by the process. The substrate may comprise at least two passive blocking elements as described hereinabove. In particular, the substrate can be configured in such a way that the blocking elements assume the closed position or the open position independently of one another.

This enables a plurality of regions of the fluid system to be selectively fluidly communicated or separated. This increases flexibility in use, in particular for more complex procedures.

The fluid system may comprise a plurality of liquid reservoirs in fluid communication with the sample chamber, and the substrate may comprise a plurality of passive blocking elements configured and arranged in such a way that, when the blocking elements are in the closed position, fluid exchange between the sample chamber and one of the liquid reservoirs is respectively blocked and/or fluid exchange between the liquid reservoirs is blocked. In particular, when the substrate comprises the plurality of passive blocking elements, the substrate may be configured in such a way that the blocking elements can independently assume a closed position or an open position. The liquid reservoirs may each be configured entirely or partially in the substrate, as described hereinabove. In particular, at least one of the passive blocking elements may be arranged in the fluid system between each of the liquid reservoirs and the sample chamber.

For example, the substrate can be configured in such a way that liquid can be supplied to the sample chamber separately from different liquid reservoirs, in particular one after the other, and/or liquid can be supplied from the sample chamber to one or more liquid reservoirs by the blocking elements assuming corresponding closed positions or open positions. This can be achieved, for example, by applying appropriate pressures to the fluid system, as explained in detail below.

The arrangement enables more complex processes involving a plurality of liquids, such as process liquids and/or flushing liquids, to be performed in the substrate without the need to completely remove the corresponding liquid from the fluid system after each step, i.e., without the need to completely replace the liquid in the fluid system. It is also made possible that such processes do not need to be supplied with liquid from outside after the initial filling of the required liquids. Therefore, the substrate can be used as an autonomous and self-contained system, especially for more complex processes. This allows flexibility in use, especially portable use, and reduces the risk of contamination from externally supplied liquids.

The fluid system may comprise a first fluid channel that is part of or directly in fluid communication with the liquid container, and a second fluid channel that is directly in fluid communication with the sample chamber. In this regard, the first fluid channel may be immediately adjacent to the second fluid channel and the blocking element may be arranged between the first fluid channel and the second fluid channel.

Therefore, for example, the fluid system may comprise two fluid channels adjacent to each other and separated by the blocking element, namely the first fluid channel and the second fluid channel, wherein the first fluid channel is part of the liquid container or is directly in fluid communication therewith, and wherein the second fluid channel opens into the sample chamber. In particular, the liquid container may comprise at least two partial areas, one of which is in the form of a chamber and the other of which is in the form of the first fluid channel, the first fluid channel opening into the chamber at one end and adjoining the second fluid channel at another location, in particular at the other end. Optionally, one, more, or all of the fluid channels may be configured in the substrate.

In particular, the fluid system may comprise at least a first sample chamber and a second sample chamber and at least two second fluid channels, wherein the first fluid channel is connected to the first sample chamber via one of the second fluid channels and to the second sample chamber via another of the second fluid channels.

The first sample chamber and the second sample chamber can each be in fluid communication with a further liquid reservoir via a further second fluid channel and a further passive blocking element, the two further liquid reservoirs being configured in such a way that they can be pressurized independently of one another.

For example, processes can be performed on a plurality of sample chambers under very comparable conditions using a compact and simple fluid structure.

In particular, liquid from the same liquid reservoirs may optionally be used in a plurality of sample chambers, or liquid from a plurality of sample chambers may be discharged into the same liquid reservoir, in particular a waste reservoir.

One of the second fluid channels may open into the first sample chamber and the other of the second fluid channels may open into the second sample chamber. The first fluid channel is adjacent to both second fluid channels and is separated from each of the fluid channels by a respective passive blocking element. Optionally, the liquid container may comprise at least two partial areas, one of which is in the form of a chamber and the other of which is in the form of the first fluid channel, the first fluid channel opening into the chamber at one end and adjoining the second fluid channels at other locations. In particular, the first fluid channel may be adjacent to one of the second fluid channels at its other end.

The fluid system may comprise at least a first blocking element and a second blocking element, at least a first liquid container and a second liquid container, at least two first fluid channels, and a second fluid channel directly in fluid communication with the sample chamber. One of the first fluid channels may be part of or directly in fluid communication with the first liquid container, and another of the first fluid channels may be part of or directly in fluid communication with the second liquid container. The first fluid channels may be immediately adjacent to the second fluid channel, and the first blocking element may be arranged between one of the first fluid channels and the second fluid channel, and the second blocking element may be arranged between the other of the first fluid channels and the second fluid channel.

In this way, liquids from several different liquid reservoirs can be supplied to the sample chamber via the second fluid channel optionally simultaneously or separately, in particular one after the other, and/or liquids from the sample chamber can be supplied optionally separately to the first liquid container or to the second liquid container or simultaneously to both liquid reservoirs.

This allows for a compact and simple fluid structure that can nevertheless be used for more complex processes.

At least a partial area, in particular all partial areas, of one of the first fluid channels may be arranged below or above the other of the first fluid channels. In particular, the one of the first fluid channels may be arranged at a level with the other of the first fluid channels at least, in particular only, in the partial area in which the one of the first fluid channels is directly adjacent to the second fluid channel. Alternatively, the first fluid channels can be arranged on one level, in particular next to each other.

The fluid system may comprise at least a first sample chamber and a second sample chamber and at least two second fluid channels, wherein at least one of the first fluid channels is connected to the first sample chamber via one of the second fluid channels and to the second sample chamber via another of the second fluid channels. In this regard, the features and advantages specified hereinabove in regard to a substrate having at least first and second sample chambers apply analogously.

The fluid system may comprise at least a first blocking element and a second blocking element, at least a first liquid container and a second liquid container, at least two first fluid channels, and at least two second fluid channels which are directly in fluid communication with the sample chamber. One of the first fluid channels may be part of or directly in fluid communication with the first liquid container and directly adjacent to one of the second fluid channels, with the first blocking element arranged therebetween. Another of the first fluid channels may be part of or directly in fluid communication with the second liquid container and directly adjacent to another of the second fluid channels, with the second blocking element arranged therebetween.

Optionally, the first blocking element may have only one direction of passage from the first liquid container into the sample chamber and the second blocking element may have only one direction of passage from the sample chamber toward the second liquid container.

Alternatively or additionally, the first blocking element may be arranged in particular above the first fluid channel adjacent to the first blocking element and below the second fluid channel adjacent to the first blocking element. Alternatively or additionally, the second blocking element may be arranged below the first fluid channel adjacent to the second blocking element and above the second fluid channel adjacent to the second blocking element.

When the fluid system, for example as described hereinabove, comprises a first fluid channel and a second fluid channel to which the first fluid channel is immediately adjacent, the first fluid channel and the second fluid channel, in a region where the first fluid channel is immediately adjacent to the second fluid channel, may be arranged to overlap one another in a plan view of the substrate, and the first fluid channel may be arranged above or below the second fluid channel in this region. In this arrangement, the blocking element can be in particular an umbrella valve. The blocking element may be arranged to overlap with the first fluid channel and the second fluid channel when viewed from above.

Optionally, the entire first fluid channel may be arranged above or below the second fluid channel. Alternatively, the first fluid channel and/or the second fluid channel may be inclined and/or angled such that only one or more partial areas of the first fluid channel are arranged above or below the second fluid channel, in particular at least one partial area that is directly adjacent to the blocking element. In particular, the first fluid channel and/or the second fluid channel may be angled.

An arrangement on several levels with overlapping fluid structures enables a compact arrangement of the substrate.

A major advantage of locating a blocking element, such as a blocking valve, between a lower and an upper channel so that the direction of flow is vertical is that the blocking element, especially if it is an umbrella valve, is easy to install with relatively few requirements for fits or mechanical precision.

The blocking element must be configured and arranged in such a way that the blocking element reliably assumes the blocking position even in the event of fluctuations in pressure applied by means of pumps, in particular even if the applied pressure ceases. This can reduce the risk of unintentional mixing of multiple liquids in the substrate.

In particular, the substrate may have at least two first fluid channels and two second fluid channels, wherein one of the first fluid channels is adjacent to each of the second fluid channels, and wherein one of the first fluid channels is arranged below the second fluid channel adjacent thereto and the other of the first fluid channels is arranged above the fluid channel adjacent thereto.

In particular, the intended direction of transport of the liquid from the first liquid container may be through one of the first fluid channels and the one of the second fluid channels into the sample chamber and through the other of the second fluid channels and the other of the second fluid channels out of the chamber. The liquid must then flow upwards through the respective blocking element, i.e. against gravity if necessary, depending on the application. This allows gravity to be used to reduce the risk of unwanted mixing of a plurality of liquids in the substrate.

The substrate can have at least one connection, for example for a pump system, the substrate being configured in such a way that gas can enter, in particular be pumped, into the liquid reservoir or precisely one of the liquid reservoirs or into two or more of the liquid reservoirs via the connection. Alternatively or additionally, the substrate may have at least a first connection and a second connection, each for the pump system, for example, wherein the substrate is configured such that gas can enter, in particular be pumped, into one of the liquid reservoirs via the first connection and gas can enter, in particular be pumped, into another of the liquid reservoirs via the second connection.

By pumping gas into the liquid container, the pressure conditions in the substrate are changed, in particular adjusted. In this way, it is possible to selectively determine which of the blocking elements assume a closed position and which of the blocking elements assume an open position. In addition, the direction in which the blocking element(s) allow(s) liquid to pass can optionally be specifically effected by pumping, i.e. the direction of passage can be adjusted.

The blocking element(s) can be characterized by a minimum pressure difference that must be present across the respective blocking element in order to open the blocking element, the so-called opening pressure difference or opening pressure for short.

For example, in the intended use, increasing the pressure in one liquid reservoir and decreasing the pressure in a second liquid container can then establish a pressure differential across a blocking element arranged between the two liquid reservoirs that is greater than the opening pressure differential. The overpressure in one liquid reservoir can be selected so low, and the underpressure in the second liquid reservoir so low, that the respective overpressure or underpressure alone is not sufficient to open the blocking element. As a result, all blocking elements in the system, to which either only the positive pressure or only the negative pressure is applied, remain blocked.

In particular, the connection may be formed as an opening in one of the outer walls of the liquid container or in a lid or plug with which the liquid container is closed.

In this opening, for example, a hose of the pump system can be connected directly, for example by inserting the hose into the opening, or an indirect connection to the hose of the pump system can be made via the opening, for example via an adapter or separate element placed on the substrate, such as a liquid container attached to the substrate (which may not be part of the substrate).

Lids or plugs can be made in particular, at least in the region of the opening, of a soft material, for example polyethylene or silicone, which results in a seal by mechanical interference fit when the tube is inserted into the opening. In particular, a plurality of lids or plugs can also be combined in one component, which is configured in such a way that it is possible to make several, in particular all, intended connections to the pump system at the same time by plugging them on once. Optionally, a lid or plug may each have a plurality of openings for pressure lines, for example, one that is provided for supplying positive pressure during proper operation and one that is provided for supplying negative pressure during proper operation. The substrate may include a sealing element formed and arranged to seal the lid or plug, for example in the form of sealant or sealing tape or in the form of an O-ring.

The substrate may include at least one filter, such as a sterile filter, configured and arranged such that gas flowing into the liquid container passes through the filter. The filter can be configured in such a way that the incoming gas is filtered, in particular that microbes are filtered out of gas. In particular, the at least one connection may include a filter and/or a filter may be attached to the connection. This can reduce the risk of contaminants entering the fluid system, especially the sample chamber.

Sterile filters can be permanently mounted on the liquid container, e.g. with a Luerlock connection. I.e., due to the sterile filters, the substrate can also be transported to non-sterile environments without making the interior of the substrate non-sterile. Gas hoses, such as those described below in connection with the system, can then be connected to the sterile filters and the containers pressurized. In this case, the sterile filters also protect the interior of the substrate from contamination.

The substrate may optionally comprise a displacement element comprising a chamber that is not in any fluid communication with the liquid container, and at least one connection, for example for a or the pumping system, wherein the displacement member is configured in such a way that pumping gas and/or liquid into the chamber increases the volume of the chamber, and wherein the substrate is configured in such a way that pumping gas and/or liquid into the chamber of the displacement member via the connection and that the volume of the liquid container is reduced when pumping gas and/or liquid into the chamber increases the volume of the chamber.

For this purpose, the chamber of the displacement element may have at least one outer wall that is deformable, in particular expandable, by pumping gas and/or liquid into the chamber. In particular, the displacement element can be in the form of a bag which is inflated when gas and/or liquid is supplied. The bag may have an expandable outer wall, in particular it may be in the form of a balloon.

The substrate can be formed in such a way that gas flowing into the chamber of the displacement element does not pass through a filter.

The displacement element allows no gas to enter the liquid container and therefore the liquid container from the outside via the connection, and yet the pressure in the fluid system can be changed by means of a pump. In this way, especially without the use of a filter, the risk of impurities entering the fluid system can be reduced.

The displacement element chamber may be located in the liquid reservoir or adjacent to the liquid reservoir in a receiver in the substrate. Due to the fact that the displacement element chamber and the liquid reservoir share a limited volume, increasing the volume of the chamber then reduces the effective volume of the liquid reservoir. Alternatively or additionally, the displacement element chamber may be configured and arranged such that an increase in the volume of the chamber moves a movable component of the displacement element such that the volume of the liquid reservoir is reduced.

The substrate may comprise two displacement elements in the form of bags, one bag initially containing fresh medium in the intended use and the second bag serving as a collection reservoir for used liquid. For example, in use in the initial situation, both bags can completely fill a recess in the substrate. If the fresh medium is now transported from one bag, for example by means of a diaphragm pump or hose squeeze pump, through the fluid system into the second bag, which serves as a collection reservoir, the total volume in the recess remains constant. This arrangement is a very space-saving variant of fluid storage.

In particular, all terminals of the substrate may each be connected exclusively to a chamber of such a displacement element. Therefore, no gas enters the fluid system from the outside through any of the connections. In particular, the fluid system can be completely sealed to the outside. The fluid system can therefore be completely isolated from the environment. In this way, especially without the use of filters, the risk of impurities entering the fluid system can be reduced.

The invention also relates to a system comprising one of the substrates described above and a pump system adapted to be connected to the substrate, in particular to one or more of the connections of the substrate. In particular, the pump system may be configured to connect to the substrate, especially the fluid system, via the connection(s) described hereinabove.

The pump system may comprise at least one pump. Optionally, it may comprise a plurality of pumps, in particular if the substrate has a plurality of connections. Then, in an arrangement for intended use, different connections may be connected to different pumps. Alternatively or additionally, the pump system can have a plurality of pumps, of which at least one pump is used only to apply negative pressure and another pump is used only to apply positive pressure in the intended use.

The pump may be an air pressure pump, in particular an air pressure pump that allows the pressure to be set in a feedback manner, for example in a range between −300 mbar and 300 mbar. In an air pressure pump, the drive fluid is gaseous, in particular it can be air. The pump may be in the form of a vibrating armature pump or diaphragm pump. Alternatively, the pump can be in the form of a piston pump, in particular a syringe pump. These types of pumps are particularly suitable for precise control of the quantity of drive fluid conveyed.

As an alternative to a gaseous drive fluid, there can be used a liquid drive fluid. In particular, as the drive fluid there can be used oil, for example mineral oil, silicone or another hydrophobic fluid, for example fluorocarbon. In particular, the pump can be a piston pump. Oils and water are hardly compressible, which makes it possible to achieve high accuracy in terms of the volumes delivered by means of the piston pump.

The pump system may comprise one or more valves and/or one or more hoses. In particular, the pump system may comprise hoses by means of which it is connected to the substrate, in particular the connections of the substrate, in the intended use. The pump system may comprise sterile filters arranged in or on these hoses in such a way that the drive fluid is filtered before entering the substrate.

In particular, the pump system may comprise at least one pump and a valve circuit, in particular configured to serve as a pressure manifold to the connection(s) of the substrate. The valve circuit may comprise active and/or passive valves.

The valve circuit may comprise at least one multi-connection valve, such as a three-connection rotary valve with three rotary positions. Alternatively or additionally, the valve circuit may include a y-connector and two tubing pinch valves. Alternatively or additionally, the valve circuit may comprise one or more electrically actuated pneumatic valves that are configured, for example, to be open when electrical voltage is applied and closed when no electrical voltage is applied or to be closed when electrical voltage is applied and open when no electrical voltage is applied. Such pneumatic valves may be mounted on a block, for example of aluminum, with channels, for example in the form of tubes, arranged in the block and ending at connections for air pressure hoses.

The valve circuit may optionally comprise microvalves that may be attached to the substrate, in particular, during the intended use. The microvalves can be configured to distribute the drive fluid to the connections of the substrate and can be switched by means of pneumatic valves or a channel squeeze mechanism. The microvalves can therefore serve as pneumatic adapters.

In the rotary valve specified hereinabove with three connections and three rotary positions, the pump can be connected to one connection of the valve and two connections of the substrate can be connected to the other two connections of the rotary valve. In a first rotational position, the passage from the pump may be interrupted, in a second rotational position, the pump may be connected to only one of the two connections of the substrate, and in the third rotational position, the pump may be connected to only the other connection of the substrate.

In the above valve circuit with a y-connector and two tubing pinch valves (SQV), three hoses can be connected to each other via the y-connector, of which a first hose is connected to the pump and the second and third hoses are each connected to a connection of the substrate. The second hose passes through a first of the tubing pinch valves and the third hose passes through a second of the tubing pinch valves. If both tubing pinch valves are closed, the drive fluid flow is interrupted. When one of the tubing pinch valves is open and the other is closed, drive fluid is pumped to only one of the substrate connections. When both tubing pinch valves are open, drive fluid is pumped to both connections of the substrate.

The system can comprise at least one adapter, in particular also an adapter strip, which is configured in such a way that the pump system is connected to the substrate in the intended use.

The system may optionally include a controller for controlling the pump system. In particular, the controller can be configured to control one or more pumps of the pump system and/or one or more valves of the pump system.

The controller can be configured in such a way that it controls the pump system, in particular one or more pumps and/or one or more valves of the pump system, in such a way that pressure is applied to the fluid system in such a way that at least one of the blocking elements assumes an open position and liquid is transported from one of the liquid reservoirs into the sample chamber and/or from the sample chamber into one of the liquid reservoirs, and optionally in such a way that at the same time at least one other of the blocking elements assumes a closed position and/or another of the blocking elements assumes an open position.

The system may optionally comprise one or more liquid reservoirs attached to the substrate in the intended use and fluidically connectable to the fluid system.

These liquid reservoirs attached to the substrate may be plugged or screwed onto the substrate in the intended use. For example, the substrate may have female Luer or Luer lock adapters, particularly at the connections described above, and the attached liquid reservoirs may each have a male Luer or Luer lock adapter that is inserted or screwed into the female Luer or Luer lock adapters in the intended use. The male Luer or Luer Lock adapter may be located at the bottom of the liquid reservoir mounted on the substrate. The liquid reservoir attached to the substrate may be in the form of a syringe. The liquid reservoirs mounted on the substrate in the intended use may be mechanically interconnected in such a way that the relative arrangement of the male Luer or Luer Lock adapters corresponds to the relative arrangement of the female Luer or Luer Lock adapters. This allows all interconnected liquid reservoirs to be attached to the substrate at the same time.

The invention also relates to a method of using any of the substrates or systems described hereinabove. The method comprises applying pressure to the fluid system, in particular by means of the pump system, in such a way that at least one of the blocking elements assumes an open position and liquid is transported from one of the liquid reservoirs into the sample chamber and/or liquid is transported from the sample chamber into one of the liquid reservoirs, and optionally in such a way that at the same time at least one other of the blocking elements assumes an open position and/or another of the blocking elements assumes a closed position.

The application of pressure may be such that a first liquid, for example a flushing liquid or a buffer, is transported from a first liquid reservoir into the sample chamber and thereby a second liquid is displaced from the sample chamber, that the second liquid is transported into a second liquid reservoir and subsequently a third liquid is transported from a third liquid reservoir into the sample chamber and thereby the first liquid is displaced from the sample chamber, in particular such that the first liquid is transported into the second liquid reservoir or into a fourth liquid reservoir. Applying pressure by means of the pump system may comprise actuating the pump or pumps and/or the valve or valves of the pump system, in particular controlling the pump or pumps and/or the valve or valves of the pump system, for example by means of a controller.

Thus, an exchange of the liquids in the sample chamber takes place. The second and third fluids may be process fluids that are replaced by this process. If the first liquid is a flushing liquid or a buffer, mixing of the process liquids in the sample chamber can be reliably prevented.

In particular, the method may also comprise testing samples, in particular cells or molecules, in the sample chamber, in particular a microscopic inspection, for example through the bottom of the sample chamber. In particular, testing before, during, and/or after transport of fluids through the sample chamber.

The method may comprise, prior to the transport of liquids described hereinabove and/or prior to testing samples, a filling of one liquid each into the or at least one of the liquid reservoirs, in particular into at least two, in particular at least three of the liquid reservoirs. The blocking element or one, several or all of the blocking elements can be in a closed position.

The method may comprise introducing a sample, in particular cells or molecules, into the sample chamber prior to testing samples, in particular prior to the transport of liquids described hereinabove. In this case the blocking element or one, several or all blocking elements can be in a closed position.

The method may comprise connecting a pump system(s) to the substrate, in particular to the connection(s) described above, prior to transporting liquids and/or testing samples as described above.

The method may comprise sealing the liquid reservoirs and/or the sample chamber, in particular sealing the fluid system, prior to transporting liquids as described above and/or prior to testing samples, in particular after filling the liquids and/or the sample.

The invention also relates to a method of using the substrate or system.

Features and benefits described above in connection with the substrate apply analogously to the system and the method.

In the following and in the figures the same reference numerals are used for the same or corresponding elements in the various embodiments unless otherwise specified. The sectional views below are each sections along the longitudinal axis of the substrate.

Figure 1B:
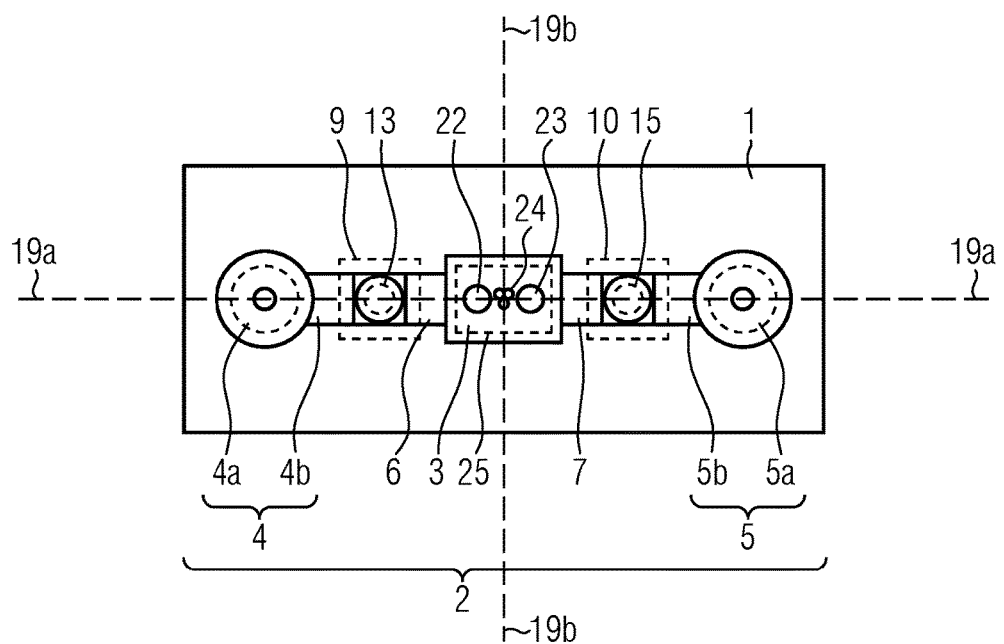

Referring now to the figures, FIGS. 1a and 1b show a first embodiment of a substrate 1 for testing samples. The substrate comprises a fluid system 2.

The fluid system comprises a sample chamber 3 configured in the substrate and a first liquid reservoir 4 connected to the sample chamber and comprising a chamber 4a and a fluid channel 4b. Further, the fluid system comprises a second liquid reservoir 5 comprising a chamber 5a and a fluid channel 5b. In the present embodiment, the liquid reservoirs 4 and 5 are configured entirely in the substrate. However, this does not have to be the case. For example, optionally at least one of the chambers may not be configured in the substrate but may be arranged in a receiver in the substrate, such as a bag as described below.

The fluid system also comprise a fluid channel 6 that is in fluid communication with the sample chamber 3 and the liquid reservoir 4. Furthermore, the fluid system comprises a fluid channel 7 fluidically connecting the sample chamber 3 and the liquid reservoir 5.

The fluid channel 6 is fluidically directly adjacent to the first liquid reservoir 4, in this embodiment for example to the fluid channel 4b. The fluid channel 7 is directly adjacent to the second liquid reservoir 5, in this embodiment for example to the fluid channel 5b.

In the top view shown in FIG. 1b, it is shown that the fluid channel 4b and the fluid channel 6 overlap each other in the area 9 where they are directly adjacent to each other, and that the fluid channel 5b and the fluid channel 7 overlap each other in the area 10 where they are directly adjacent to each other.

In the sectional view shown in FIG. 1a, the fluid channel 4b is shown to be located below the fluid channel 6 in the area 9 where the fluid channel 4b and the fluid channel 6 overlap. Furthermore, in the sectional view shown in FIG. 1a, the fluid channel 5b is arranged above the fluid channel 7 in region 10 where the fluid channel 5b and the fluid channel 7 overlap.

In the present example, the fluid channels 4b, 6 and 7 each run horizontally. The fluid channel 5b is angled and comprises two horizontally extending partial areas and a vertically extending partial area connecting the two horizontal partial areas. One of the horizontal partial areas is immediately adjacent to the fluid channel 7, and the other of the horizontal partial areas is immediately adjacent to the chamber 5a.

Just as an example, the fluid channel 4b, the fluid channel 7, and one of the horizontal partial areas of the fluid channel 5b, in particular the partial area of the fluid channel 5b immediately adjacent to the chamber 5a, are arranged in a first plane 11. The fluid channel 6 and the one other of the horizontal partial areas of the fluid channel 5b, in particular the portion of the fluid channel 5b immediately adjacent to the fluid channel 7, are arranged in a second plane 12. In this example, the first level is arranged below the second level.

The substrate further comprises a first passive blocking element 13 configured and arranged to block fluid exchange between the sample chamber and the first liquid reservoir 4. In particular, the first passive blocking element is arranged between the fluid channel 4b and the fluid channel 6 and is immediately adjacent to the fluid channel 4b and the fluid channel 6. The blocking element 13 is arranged in the area 9 where the fluid channel 4b and the fluid channel 6 overlap each other.

The first blocking element can be in the form of a check valve, for example in the form of an umbrella valve. The operation of such a check valve will be explained in more detail in connection with FIGS. 2a to 2c. As an alternative to an umbrella valve, a duckbill valve or other valve can be used. The blocking element 13 can, for example, have a passage direction 14. Alternatively, a blocking element can be used that has two passage directions.

The substrate further comprises a second passive blocking element 15 configured and arranged to block fluid exchange between the sample chamber and the second liquid reservoir 5. In particular, the second passive blocking element is arranged between the fluid channel 5b and the fluid channel 7 and is immediately adjacent to the fluid channel 5b and the fluid channel 7. The blocking element 15 is arranged in the area 10 where the fluid channel 5b and the fluid channel 7 overlap each other.

Also the second blocking element 15 can be in the form of a check valve, for example in the form of an umbrella valve. The blocking element can, for example, have a passage direction 16. Alternatively, a blocking element can be used that has two passage directions.

FIGS. 1a and 1b also show a first connection 17, here in the form of an opening. The substrate, in particular the first liquid reservoir 4, can be connected to a pump system via this connection. This pump system is not part of the substrate. The connection is arranged on the upper outer wall of chamber 4a, here formed as an opening in the upper outer wall. Alternatively, the connection can be provided on a side wall or the bottom of the chamber. Here, the upper outer wall is part of a removable lid 8 of the chamber 4a.

Also shown in FIGS. 1a and 1b is a second connection 18, here in the form of an opening. The substrate, in particular the second liquid reservoir 5, can be connected to a pump system via this connection. The connection is arranged on the upper outer wall of chamber 5a, here formed as an opening in the upper outer wall. Alternatively, the connection can be provided on a side wall or the bottom of the chamber. Here, the upper outer wall is part of a removable lid 8 of the chamber 5a.

For illustrative purposes, FIGS. 1a and 1b indicate the longitudinal axis 19a, the transverse axis 19b, and the vertical axis 19c of the substrate.

In the embodiment shown in FIGS. 1a and 1b, the substrate 1 is multi-part and comprises a structured bottom plate 20 and a structured cover plate 21.

In addition, FIGS. 1a and 1b show two openings 22 and 23 arranged immediately above the sample chamber. In the figures, the openings are shown in a closed state with a lid 22a and 23a, respectively. Prior to sealing, one of the openings 22 may be used to fill the sample chamber with the sample. In this regard, the other opening 23 may also be unsealed and serve to allow air to escape from the sample chamber during or after filling of the sample chamber. One or both of lids 22a and 23a may have connections for a compressed air system.

For illustrative purposes, FIGS. 1a and 1b show a sample 24, which may be arranged in the sample chamber during the intended use. FIGS. 1a and 1b show an example of the sample in the form of a plurality of cells 24a.

An observation region 25 for observing the samples in the intended use is also indicated in FIG. 1b. In FIGS. 1a and 1b, a transport direction 29 of the liquid through the fluid system provided in the intended use is also indicated with arrows.

In FIG. 1a, hoses 48 and 50 connected to the connections and a pump 47 are shown for better understanding, but are not part of the substrate.

Optionally, the entire substrate or only a portion of the substrate may be transparent, in particular formed from a transparent plastic material. In particular, the bottom of the sample chamber can be transparent. In particular, the substrate can be configured in such a way that the cells contained therein can be inspected microscopically.

When positive pressure is applied to the liquid reservoir 4 in a substrate shown as in FIGS. 1a and 1b, fluid is transported into the chamber through the fluid channel 4b and the fluid channel 6 and out of the chamber through the fluid channel 7 into the liquid reservoir 5. The locking elements 13 and 15 are arranged in such a way that this corresponds to the opening direction and, as a result of the application of the overpressure, the blocking elements assume the open position. On the other hand, if a negative pressure is applied to the chamber 4, the blocking element 13 assumes a blocking position and no liquid can be exchanged between the sample chamber and the liquid reservoir 4. For example, in the arrangement shown in FIGS. 1a and 1b, unused process liquid can be stored in the liquid reservoir 4 and passed through the sample chamber as needed and then fed to the liquid container 5. The liquid reservoir 5 can serve as a waste reservoir. If the substrate has a plurality of sample chambers and/or liquid is supplied to the sample chamber from a plurality of additional liquid reservoirs, the liquid reservoir 5 may also be configured for liquids from a plurality of the sample chambers and/or from a plurality of liquid reservoirs. Alternatively or additionally, the substrate may comprise at least one additional waste reservoir.

Figure 2A:
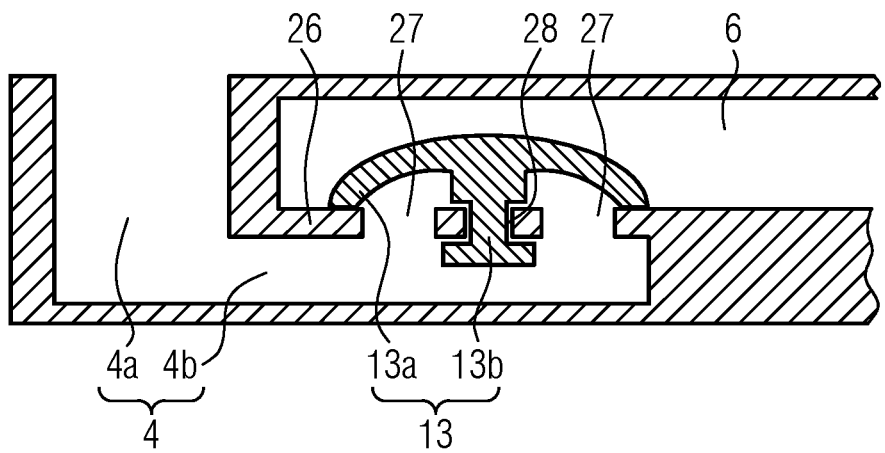
FIGS. 2a to 2c show schematic, not to scale, cross-sectional views of a blocking element in the form of a check valve.
Figure 2B:
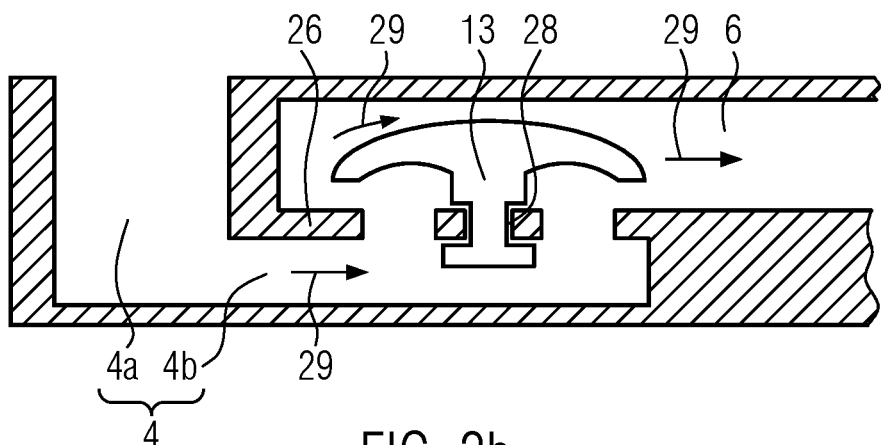
Figure 2C:
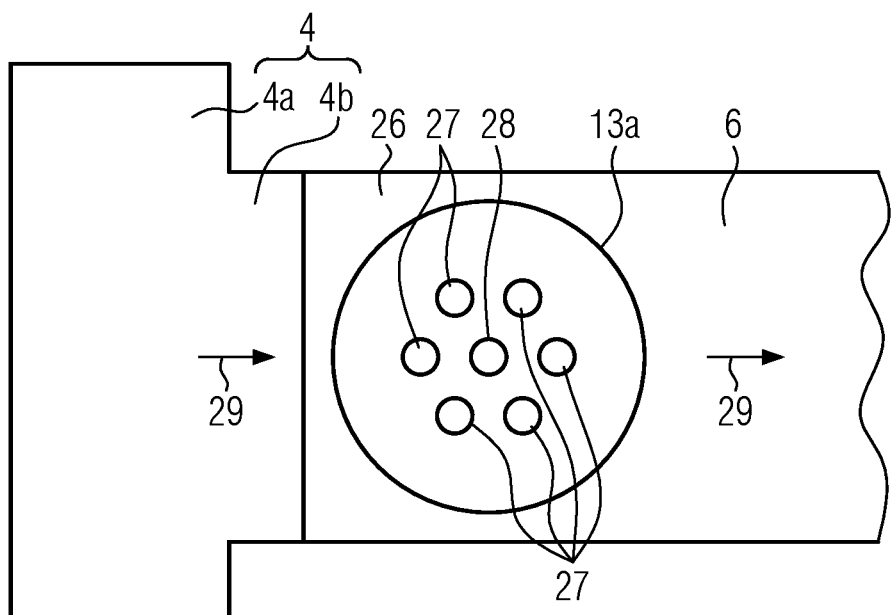

FIGS. 2a to 2c show an example of the operation of a blocking element in the form of a check valve, here using the example of an umbrella valve. For illustration purposes, in FIGS. 2a to 2c, the blocking element is arranged like the blocking element 13 in FIGS. 1a and 1b.

FIGS. 2a to 2c show that a horizontally arranged wall 26 is arranged between the fluid channel 4b and the fluid channel 6 in the area of the valve. The wall has one or more connecting holes 27 arranged around a central hole 28 below the umbrella 13a of the umbrella valve. The umbrella valve is fixed by means of the central bore, in particular by means of an anchoring element 13b of the umbrella valve, which is anchored in the central bore.

Depending on the pressure P1 applied to the fluid channel 4a and the pressure P2 applied to the fluid channel 6, the fluidic behavior of the check valve changes. In particular, the fluidic behavior of the check valve changes depending on the pressure difference between P1 and P2. When P1 and P2 are equal, the valve assumes a closed position, i.e. it is closed. If the pressure P2 is greater than P1, i.e. the pressure difference has a negative value, which is referred to as back pressure, this reliably keeps the valve in the closed position and thus supports the closing action of the valve. For example, this can be achieved by P2 being the ambient pressure and P1 being a negative pressure generated by a pump, for example. Alternatively, this can be achieved, for example, if P1 corresponds to the ambient pressure and P2 is a positive pressure generated by a pump, for example. If the pressure difference is below a threshold value, also known as opening pressure, the valve also assumes a closed position, i.e. it is closed. The valve in blocking position is shown in FIG. 2a. If the pressure difference is greater than or equal to the threshold value, the valve assumes an open position, i.e. it is open. The valve in open position is shown in FIG. 2a.

In the case of the umbrella valve, the umbrella 13a of the umbrella valve rests on the wall 26 in the closed position in such a way that no liquid is exchanged between the fluid channel 4a and the fluid channel 6. In particular, the bearing surface of the umbrella surrounds all the connection holes. In the open position, the umbrella is lifted from the support surface, allowing liquid to flow between the fluid channel 4a and the fluid channel 6. Due to the pressure difference required to open the umbrella valve, the liquid flows here primarily from the fluid channel 4a into the fluid channel 6.

FIG. 2c shows a top view, in which it can be seen in particular how the connection holes are arranged relative to the valve.

Figure 3A:
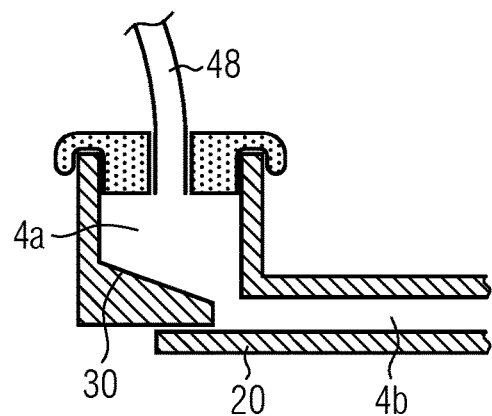
FIGS. 3a to 3c show schematic, not to scale, cross-sectional views of a substrate in the region of a liquid reservoir.
Figure 3B:
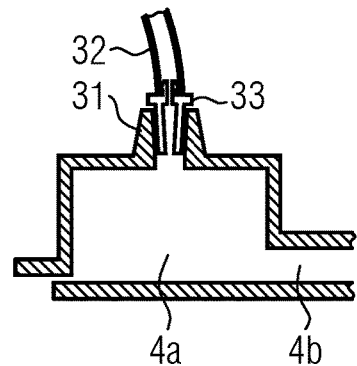
Figure 3C:
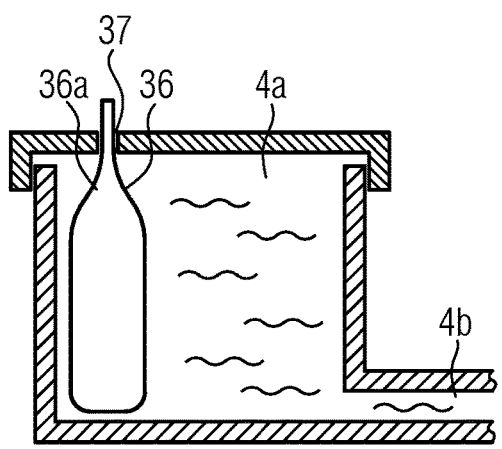
Figure 3C:
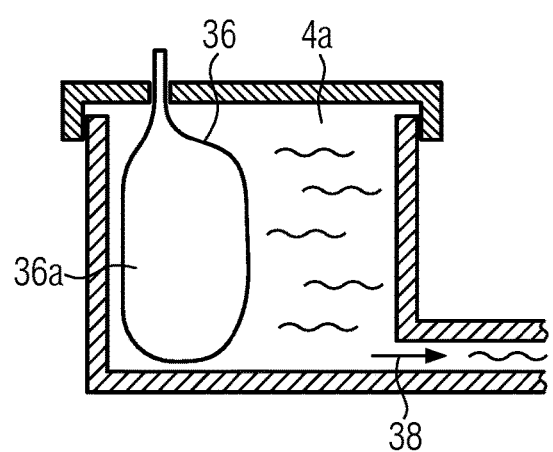

FIGS. 3a to 3c each show cross-sectional views of the substrate in the region of a liquid reservoir. A substrate according to the invention may be formed in the region of one, more or all of the liquid reservoirs as shown in these figures.

FIG. 3a shows a cross-sectional view of a substrate 1 in the region of a liquid reservoir 4a, which is configured essentially as shown in FIGS. 1a and 1b. Unlike FIGS. 1a and 1b, the bottom of the chamber may be configured to comprise one or more partial areas 30 that slope toward the fluid channel 4b. In other words, the bottom of the chamber may have slopes that slope toward the fluid channel. In particular, the liquid reservoir can have a shape of a funnel. If the substrate comprises a bottom plate and a cover plate, the inclined partial areas may be configured in particular in the cover plate, as shown in FIG. 3a.

FIG. 3a shows a cross-sectional view of a substrate 1 in the region of a liquid reservoir 4a, which is configured essentially as shown in FIGS. 1a and 1b. Unlike FIGS. 1a and 1b, the substrate has an adapter 31, here exemplarily a female Luer adapter. For example, a pump system not shown here can be connected to the adapter by means of a hose 32. In particular, a male Luer adapter 33 may be attached to the end of the tubing for connection to the female Luer adapter. The tubing and male Luer adapter are not part of the substrate and are shown here for illustrative purposes only. However, they can be part of a system according to the invention. Unlike in FIG. 3a, where the connection is arranged in a [!], here the connection in FIG. 3b is arranged in the cover plate of the substrate, which forms the upper outer wall of chamber 4a.

FIG. 3c shows cross-sectional views of a substrate 1 in the region of the chamber 4a of a liquid reservoir. Here, the chamber 4a is formed in the substrate and a displacement element 36 in the form of a bag is arranged in the chamber, which can be connected to a pump system via a connection 37 of the substrate or can form a chamber of a liquid reservoir of the fluid channel system. In the intended use, increasing the volume of the bag 36 can displace liquid contained in the chamber 4a from the chamber in the direction of the arrow 38. Optionally, liquid or gas located in the bag may be displaced from the bag by liquid pumped into chamber 4a.

Various states of the system are shown in the figure, namely a first state in which the bag 36 displaces little volume in the chamber 4a, and a second state in which the bag 36 is partially inflated and displaces enough volume in the chamber 4a to transport fluid from the chamber 4a in the direction of the arrow 38 into the fluid channel 4b. The bag may be configured so that it is slack when not pressurized. The bag may be configured in such a way that its volume can be increased by pressurization such that it fills substantially the entire chamber. The bag may have walls that are elastic, in particular such that expansion of the walls caused by filling with liquid and/or by inflation is reversible. The bag may be in the form of a balloon.

Chamber 4a is not connected to the pump system. This makes it easier to maintain sterility. In addition, transport of fluids independent of position relative to the gravity vector is easier.

As an alternative to the pouch being connectable to a pump via a connection of the substrate, the bag may form one of the chambers of a liquid reservoir of the fluid channel system and may be connected to a fluid channel. For example, transport of a liquid into the bag may thus cause transport of a liquid out of the chamber 4a. In particular, the bag can serve as a collection reservoir for used liquid.

As a variation of the arrangement shown in FIG. 3c not shown in the figures, the displacement element 36 described above may be arranged in a receiver in the substrate, and the chamber 4a of the liquid reservoir may be formed as a second bag. The second bag may be configured in such a way that when there is no liquid therein and no pressurization, it is slack. The second bag may have walls that are elastic, particularly in such a way that expansion of the walls caused by filling with liquid is reversible. The bag may be in the form of a balloon.

In the embodiment shown in FIG. 3c and its variations, an elastic material that is stretched during inflation may be used for the bag 36. The bag then generates a pressure that compresses any compressible medium such as air. In the event that one wishes to control the displaced volume in the chamber of the liquid reservoir on the basis of the quantity of medium pumped into the bag 36, it is purposeful to measure the pressure in the bag 36 continuously and to compensate the mass of gas to be transported to the respective pressure value accordingly. In this case, the ideal gas equation $p \, V = n \, R \, T$ serves as the basis for calculation.

Figure 4:
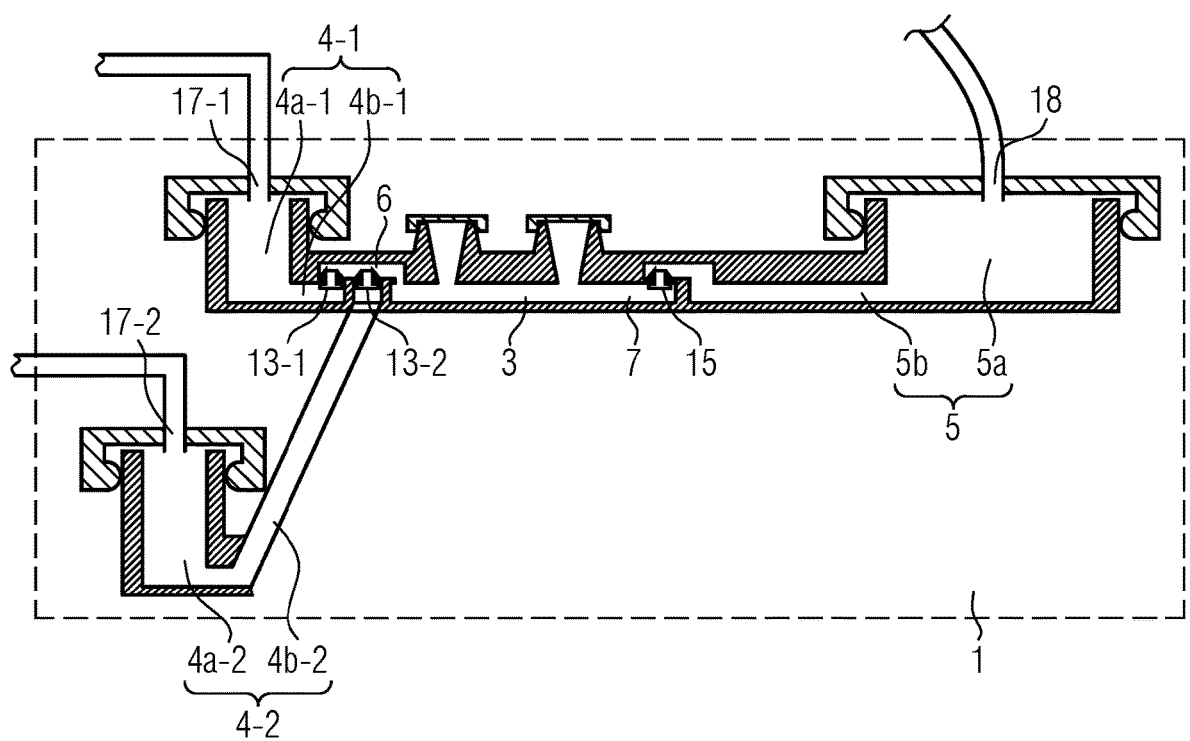
FIG. 4 shows a schematic not to scale cross-sectional view of a substrate of a second embodiment.

FIG. 4 shows a second embodiment of the substrate. For example, the substrate may be formed in principle as described above, but may comprise liquid reservoirs 4-1 and 4-2 instead of liquid reservoir 4. The liquid reservoir 4-2 may comprise a chamber 4a-2 and a fluid channel 4b-2, and may be connected to the fluid channel 6 via a blocking element 13-2. The liquid reservoir can be connected to a pump system via a connection 17-2. Alternatively, it may be connected only to the fluid channel and fluid transport may occur by displacement of the fluid from the chamber, for example as shown in FIG. 3c. Chambers 4a-1 and 4a-2 may be arranged at different heights, as shown here. In particular, one chamber may be arranged below the other chamber and may overlap it completely or partially in plan view. Alternatively, the chambers can be arranged on one level. The chambers can therefore be arranged next to each other. The liquid reservoirs 4-1 and 4-2, blocking elements 13-1 and 13-2, and connections 17-1 and 17-2 may each be formed, for example, as described above in connection with the liquid reservoir 4, the blocking element 13, and the connection 17.

The operation of the substrate is similar to that described above in connection with FIGS. 1a and 1b. A positive pressure can be applied to the liquid reservoirs 4-1 and 4-2, for example one after the other, for example first to the liquid reservoir 4-1 and then to the liquid reservoir 4-2, while in each case no positive pressure or a negative pressure is applied to the other liquid reservoir. As a result, liquid is first transported from the one liquid reservoir 4-1 into the sample chamber 7. If there is already liquid, for example a first process liquid, in the sample chamber, it will be displaced by the liquid from the liquid reservoir 4-1 and transported into the liquid reservoir 5. If positive pressure is then applied to the liquid reservoir 4-2, the liquid is transported from this liquid reservoir into the sample chamber. If liquid is still present there, it is also displaced and transported, for example, into the liquid reservoir 5. In this way, for example, process liquids can be replaced in the sample chamber. Preferably, then, the liquid in the liquid reservoir 4-1 is a buffer or flushing liquid and the fluid in the liquid reservoir 4-2 is a second process liquid.

Figure 5A:
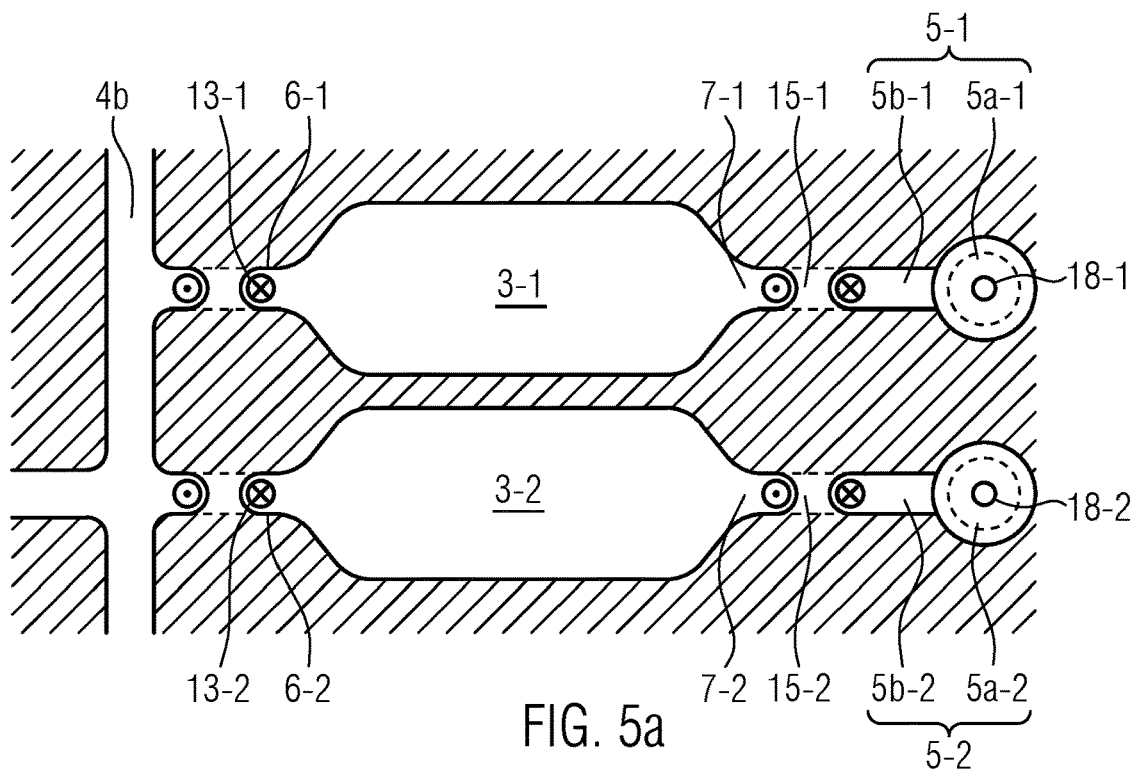
FIGS. 5a to 5c show schematic, not to scale, representations of partial areas of a substrate.

FIG. 5a shows a portion of a substrate in which a plurality of fluid channels 6-1 and 6-2, here exemplarily two, are adjacent to the fluid channel 4b of the first liquid reservoir 4. For illustrative purposes only, a representation is chosen here in which the fluid channels 6-1 and 6-2 are not shown overlapping with the fluid channel 4b, but offset to the right, so that the passage directions and blocking directions of the blocking elements 13-1 and 13-2 can be seen more clearly. A blocking element 13-1 and 13-2 is arranged between each of the fluid channel 4b and the fluid channels 6-1 and 6-2, for example one of the blocking elements described above. The substrate comprises a plurality of sample chambers 3-1 and 3-2, for example two in this case, with fluid channel 6-1 opening into sample chamber 3-1 and fluid channel 6-2 opening into sample chamber 3-2.

The substrate further comprises two liquid reservoirs 5-1 and 5-2, each comprising a chamber 5a-1, 5a-2 and a channel 5b-1, 5b-2. The substrate further comprises a fluid channel 7-1 adjacent to the fluid channel 5b-1 of the liquid reservoir 5-1, having a blocking element 15-1 arranged therebetween, and a fluid channel 7-2 adjacent to the fluid channel 5b-2 of the liquid reservoir 5-2, with a blocking element 15-2 arranged therebetween.

The substrate is configured in such a way that the liquid reservoir 5-1 and liquid reservoir 5-2 can be pressurized independently of each other, for example, each via its own connection 18-1, 18-2.

Fluid channel 7-1 opens into sample chamber 3-1 and fluid channel 7-2 opens into sample chamber 3-2. The liquid reservoirs and sample chambers may each be configured and arranged as described hereinabove. The sample chambers can be arranged at the same height.

As an alternative to the variant shown in FIG. 5a, in which a plurality of sample chambers are connected to a common first fluid channel 4b and to separate second fluid channels 5b-1, 5b-2, a plurality of sample chambers may be connected to a common second fluid channel 5b and to separate first fluid channels and corresponding liquid reservoirs. The substrate can then be configured in such a way that these liquid reservoirs can be pressurized independently of each other.

Both alternatives allow selective fluid transport, with reduced number of channel structures.

Just as an example, the substrate may have an arrangement of chambers and fluid channels as shown in European patent application number 20160085.5, wherein a blocking element according to the invention may be arranged at one or more of the mouths of the channels or chambers shown therein. The blocking elements make it possible to protect the liquid in the cell culture areas described in said patent application from diffusion-induced mixing with other liquids over longer periods of time.

Figure 5B:
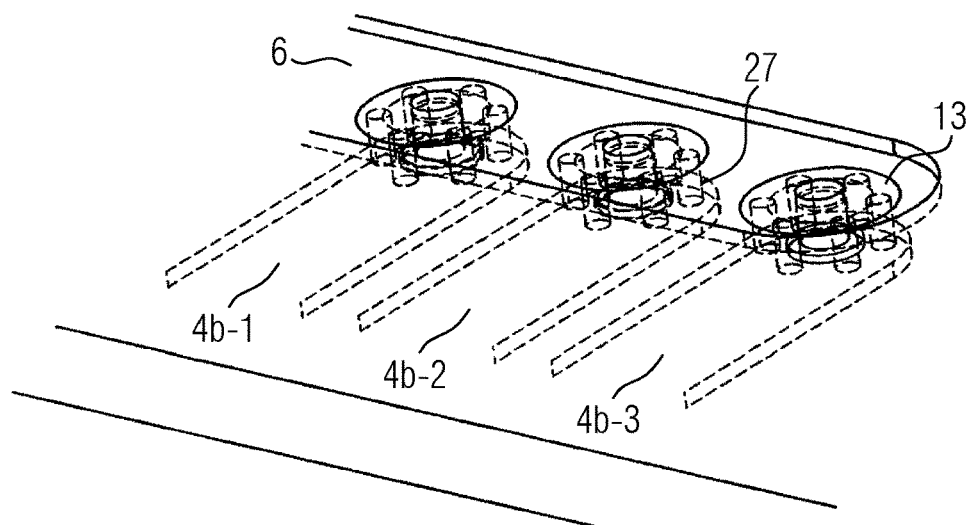

FIG. 5b shows a part of a substrate having a plurality of liquid reservoirs, each comprising a fluid channel 4b-1, 4b-2, and 4b-3. Each of the fluid channels is adjacent to fluid channel 6, with a blocking element 13 arranged therebetween. In the example shown here, for example, it is a valve as shown in FIGS. 2a to 2c, but other blocking elements can be used instead. The fluid channel 6 is fluidically connected to the sample chamber, for example as shown in FIGS. 1a and 1b.

Figure 5C:
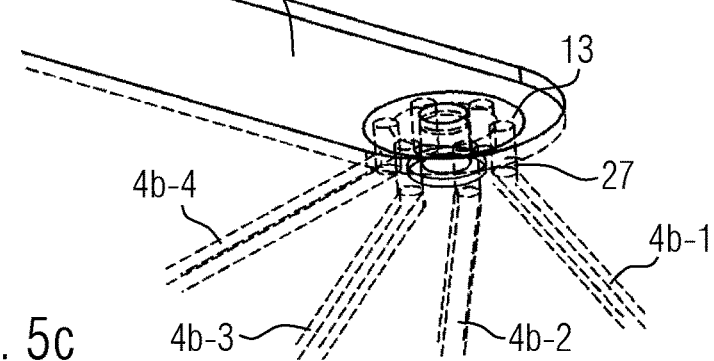

In FIG. 5c, the substrate comprises a plurality of liquid reservoirs each comprising a fluid channel 4b-1 to 4b-4, wherein the fluid channels 4b-1 to 4b-4 are connected to the fluid channel 6 via a single blocking element 13. This is a particularly space-saving embodiment.

Figure 6A:
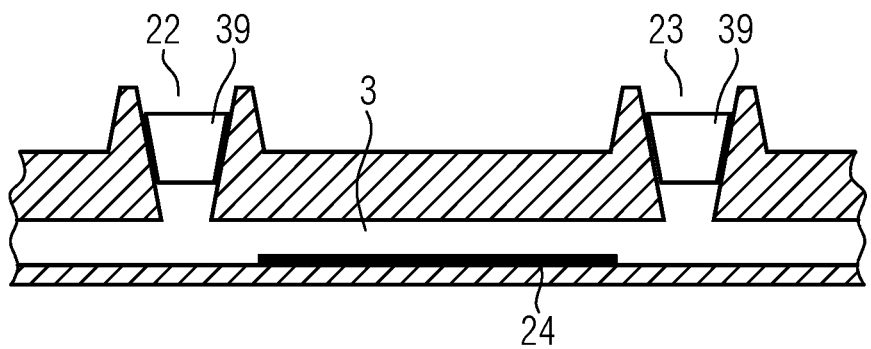
FIGS. 6a to 6c show schematic, not to scale, representations of sample chambers.

FIG. 6a shows an example of a part of a substrate, in particular the sample chamber 3. Openings 22 and 23 are arranged above the sample chamber, through which samples, for example cells, can be introduced into the sample chamber and/or through which air can escape before closing. The openings can each be closed with a plug 39, for example. The openings and plugs can be conical in shape, for example. Apart from this, the substrate can be formed, for example, as described above. In the present example, it is shown that a sample 24, in particular in the form of cells, is arranged in a partial area of the bottom of the sample chamber. In particular, the bottom may be covered with adherent cells in the intended use. The partial area of the bottom is arranged between the openings 22 and 23 and can be considered as an observation region. In particular, the bottom can be in the form of a cover glass through which the cells can be microscoped.

Figure 6B:
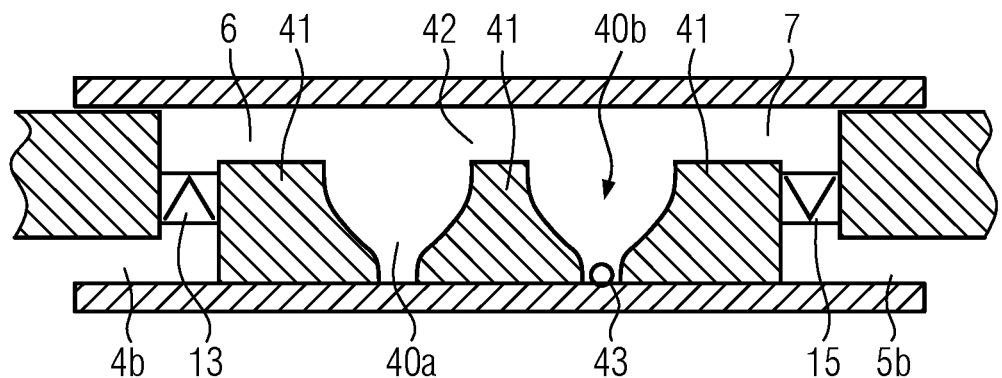
Figure 6C:
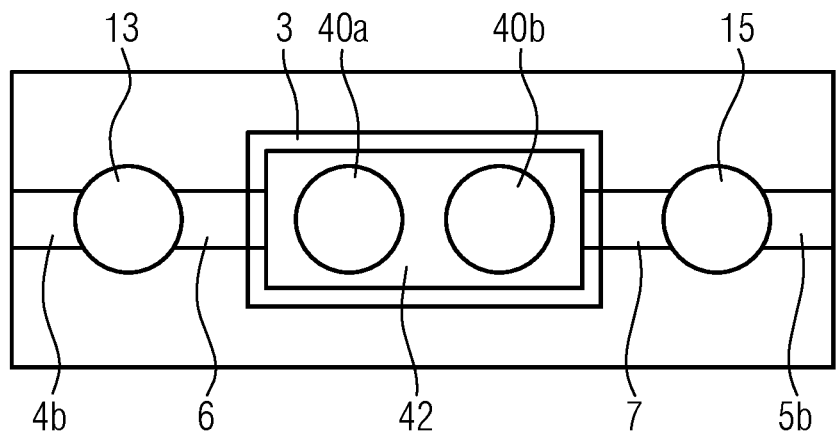

FIG. 6b shows an example of a part of a substrate, in particular the sample chamber 3, in a cross-sectional view. FIG. 6c shows the part of the substrate that is shown in FIG. 6b in a cross-sectional view in plan view. The sample chamber has a plurality of reservoirs 40a and 40b in the form of little pots, each tapering downward here. The little pots are bounded on the sides by walls 41. The sample chamber also comprises a fluid channel 42 adjacent the top of the little pots. The fluid channels 6 and 7 open into the fluid channel 42. Fluid can thus be transported, for example, successively through fluid channel 6, fluid channel 42 and fluid channel 7. The fluid channel 42 is configured and arranged in such a way that when liquid is transported through the fluid channel 42, the liquid flows along the top of the pots. When cells are arranged in the little pots in the intended use, the cells are superfused as a result. Apart from this, the substrate can be formed, for example, as described above.

First of all, the sample chamber can have the shape of a cuboid. Then the sample, for example cells, can be placed in the little pots and the sample chamber closed, for example with a cover glass. The cover glass can be fixed with double-sided adhesive tape, for example. The cells may optionally be introduced into the pots in the form of spheroids 43 or form spheroids in the little pots.

Figure 7A:
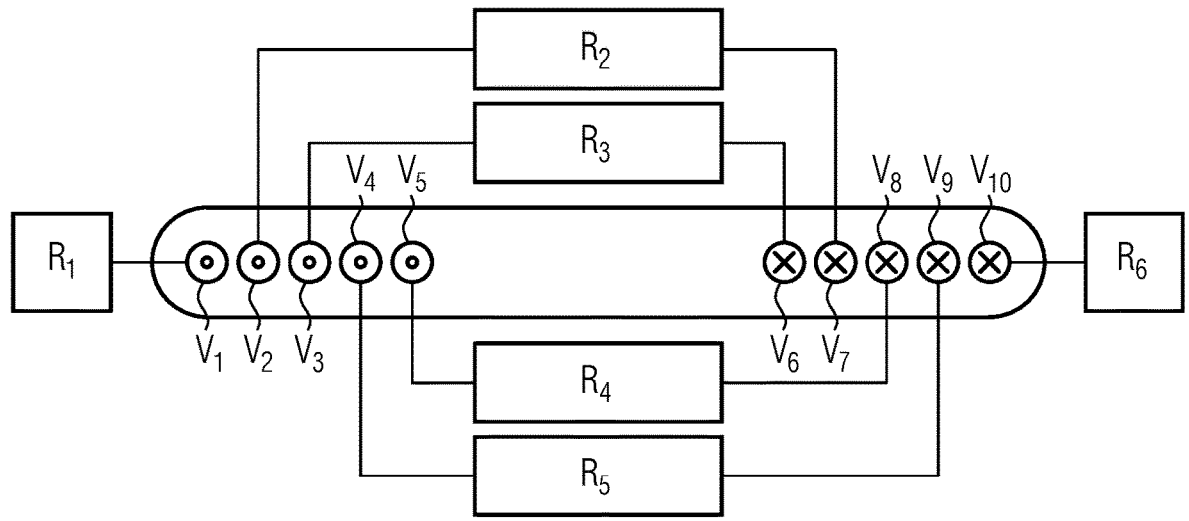
FIGS. 7a and 7b show schematic, not to scale, representations of possible configurations of the fluid system and blocking elements.
Figure 7B:
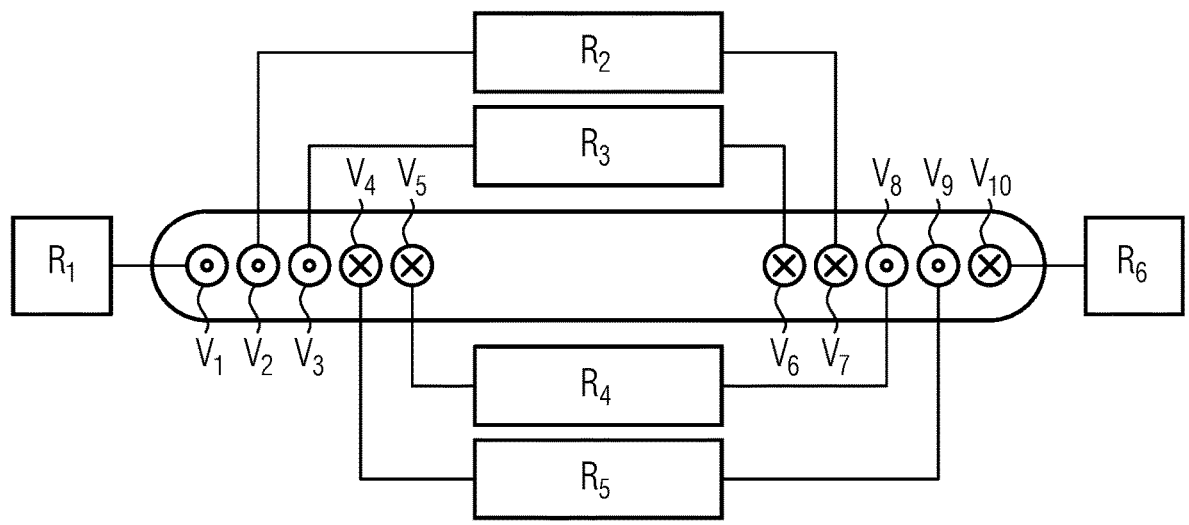

FIGS. 7a and 7b each show schematically in plan view an example of a substrate with six liquid reservoirs R1, R2, R3, R4, R5 and R6. Each of the reservoirs may be configured, for example, as described above in connection with liquid reservoir 4 and 5. Each of the liquid reservoirs is connected to the sample chamber by at least one fluidic connection via a blocking element. Each of the liquid reservoirs R1 and R6 is connected to the sample chamber by only one fluidic connection. The liquid reservoir R1 is connected to the sample chamber via the blocking element V1, and the liquid reservoir R6 is connected to the sample chamber via the blocking element V10. The liquid reservoir R2 has two fluidic connections to the sample chamber, one via the blocking element V2 and one via the blocking element V7, wherein the blocking elements V2 and V7 may be check valves, wherein one of the check valves may have a direction of flow toward the sample chamber and the other of the check valves may have a direction of flow out of the sample chamber. The liquid reservoir R3 has two fluidic connections to the sample chamber, one via the blocking element V3 and one via the blocking element V6, wherein the blocking elements V3 and V6 may be check valves, wherein one of the check valves may have a direction of flow toward the sample chamber and the other of the check valves may have a direction of flow out of the sample chamber. The liquid reservoir R4 has two fluidic connections to the sample chamber, one via the blocking element V5 and one via the blocking element V8, wherein the blocking elements V5 and V8 may be check valves, wherein one of the check valves may have a direction of flow toward the sample chamber and the other of the check valves may have a direction of flow out of the sample chamber. The liquid reservoir R5 has two fluidic connections to the sample chamber, one via the blocking element V4 and one via the blocking element V9, wherein the blocking elements V4 and V9 may be check valves, wherein one of the check valves may have a direction of flow toward the sample chamber and the other of the check valves may have a direction of flow out of the sample chamber.

The liquid reservoirs can be configured and arranged in such a way that the fluid channels do not cross each other. Alternatively or additionally, the liquid reservoirs can be formed and arranged such that the fluid channels all have the same length. Alternatively or additionally, the liquid reservoirs can be formed and arranged in such a way that the fluid channels all have the same length.

FIGS. 7a and 7b each differ in the direction of passage of the valves, one direction being indicated by dots and the other by crosses. The arrangement of the valves results in the flow directions in the intended use.

These flow directions are described below by way of example. When positive pressure is applied to liquid reservoir R1 and negative pressure is applied to reservoir R6 at the same time, liquid flows through valve V1 into the sample chamber and through valve V10 into liquid reservoir R6.

When positive pressure is applied to liquid reservoir R2 and negative pressure is applied to reservoir R3 at the same time, liquid flows through valve V2 into the sample chamber and through valve V6 into liquid reservoir R3.

When positive pressure is applied to liquid reservoir R3 and negative pressure is applied to reservoir R2 at the same time, liquid flows through valve V3 into the sample chamber and through valve V7 into liquid reservoir R2. This applies analogously to the R4 and R5 liquid reservoirs.

If the liquid reservoirs and the valves are configured and arranged as in FIG. 7a, the liquid flows through the sample chamber in the same direction during transport from R2 to R3 as during transport from R3 to R2. This applies analogously to the R4 and R5 liquid reservoirs. In addition, the liquid flows through the sample chamber in the same direction during transport from R2 to R3 as during transport from R4 to R5. In addition, the liquid flows through the sample chamber in the same direction during transport from R2 to R3 as during transport from R1 to R6.

If the liquid reservoirs and the valves are configured and arranged as in FIG. 7b, the liquid flows through the sample chamber in the same direction during transport from R2 to R3 as during transport from R3 to R2. This applies analogously also to the R4 and R5 liquid reservoirs. Unlike the arrangement in FIG. 7a, however, the liquid flows through the sample chamber in the opposite direction during transport from R2 to R3 than during transport from R4 to R5.

Figure 8:
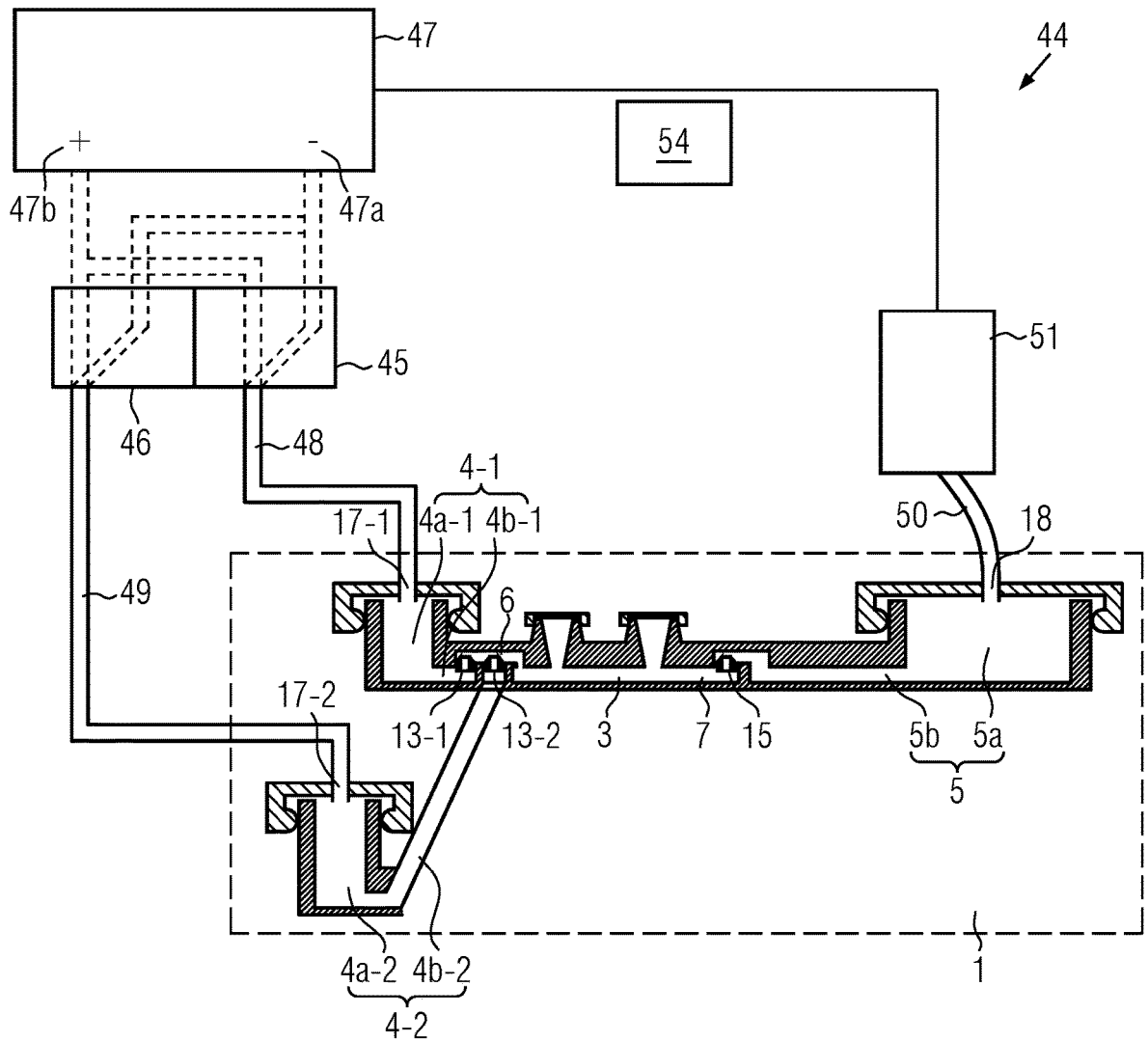
FIG. 8 shows a schematic not to scale representation of an embodiment of a system.

FIG. 8 shows an example of a system 44 according to the invention with a substrate 1 as described in connection with FIG. 4. Alternatively, the system may comprise another of the substrates described above, for example as described in connection with FIG. 1, or another substrate according to the invention.

In this embodiment, the system comprises valves 45 and 46 and a pump 47 having a negative pressure outlet 47a and a positive pressure outlet 47b, each of which is connected to one or both of the valves 45 and 46 in the intended use. The system further comprises hoses 48 and 49, each of which is connected to one of valves 45 and 46 and to one of connections 17-1 and 17-2 of the substrate in the intended use. A tube 50 is connected to the connection 18 of the substrate. This hose can also optionally be connected to the pump 47 via a valve 51.

The system may comprise a controller 54 configured to control one or more of the valves and/or one or more of the pumps.

Figure 9A:
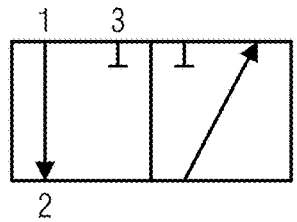
FIGS. 9a to 9e show schematic not to scale representations of sample chambers.

FIG. 9a shows a schematic representation of a valve that can be used as valve 45, valve 46 and/or valve 51. This is a 3/2-way valve. For example, a first connection of the valve may be connected to the overpressure outlet 47b of the pump and a second connection may be connected to the substrate. A third connection of the valve can optionally be connected to the vacuum outlet 47a of the pump. Alternatively, the third connection can be connected to ambient air or to another pump. The third connection, when connected to a pump, can be used to apply a vacuum to the respective liquid reservoir during operation. This allows the locking effect to occur on the blocking element.

Figure 9B:
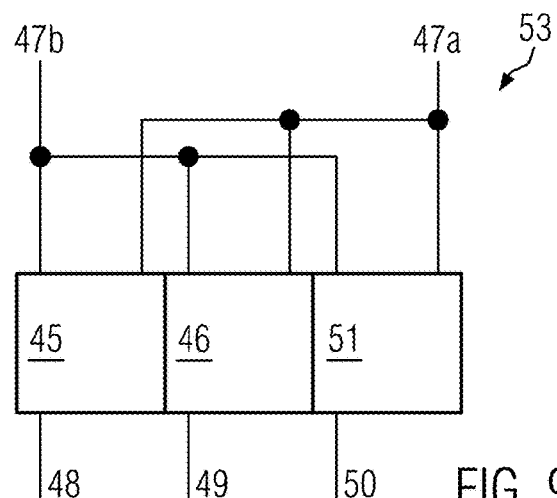

FIG. 9b shows how the valve circuit may look when each of the valves 45, 46 and 51 is connected via two of its connections to the pump 47, more specifically to the negative pressure outlet 47a and the positive pressure outlet 47b.

Figure 9C:
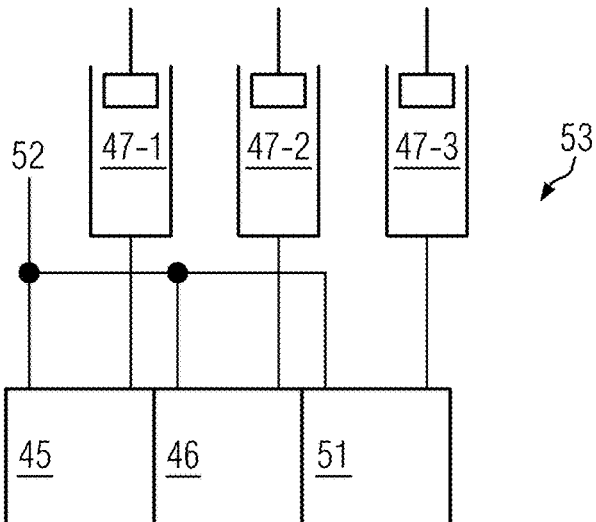

FIG. 9c shows how the valve circuit may look when each of the valves has one of its connections connected to a pump 52, for example for generating negative pressure, and another of its connections connected respectively to another pump 47-1, 47-2 and 47-3, for example for generating positive pressure for transport. This has the advantage that the positive pressure used to drive the fluid in the substrate can be provided independently for each of the liquid reservoirs, but the negative pressure that assists in sealing the blocking element can be easily provided by a common pump.

Figure 9D:
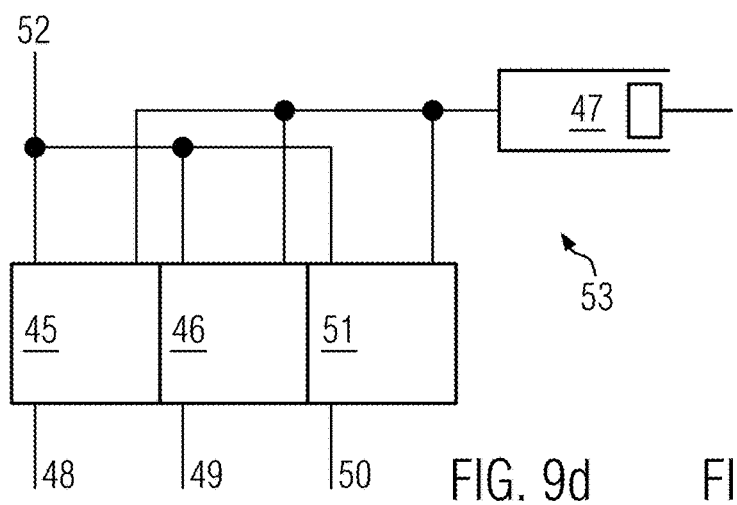

FIG. 9d shows how the valve circuit may look when each of the valves 45, 46 and 51 has one of its ports connected to the pump 47 and another of its connections connected to the further pump 52, wherein the pump 47 may be provided to provide the positive pressure and the pump 52 may be provided to provide the negative pressure.

Figure 9E:
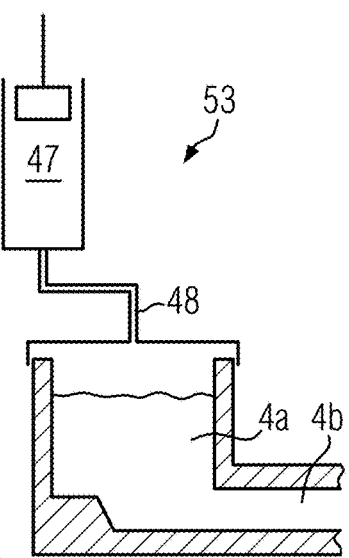

Alternatively or additionally, at least one of the liquid reservoirs 4 can be connected directly to a pump 47 via a hose 48, i.e. without an intermediate valve, as shown in simplified form in FIG. 9e.

Pumps 47, 47-1, 47-2, 47-3 and/or 52 may each be in the form of a piston pump, peristaltic pump, c or screw pump. Especially for the pump provided for applying the overpressure, it is advantageous if the pump is configured in such a way that controllable volumes can be transported with it.

All pumps connected to the substrate and, if applicable, valves and hoses together form the pump system 53.

With regard to the function of the system, it should be noted that depending on the locking elements used, certain designs and modes of operation may be more advantageous than others. For example, in a duckbill valve, it is advantageous to apply back pressure to close the valve safely.

A method according to the invention comprises applying pressure to the fluid system 2 of one of the substrates 1 described above, for example by means of one of the systems 44 described above, more precisely by means of one of the pump systems 53 described above. In particular, the pressure can be applied so that the blocking element 13 or one of the blocking elements 13-1 and 13-2 assumes a let-through position, i.e. is open, and liquid is transported from the liquid reservoir 4 or one of the liquid reservoirs 4-1 and 4-2 into the sample chamber 3. The pressure can optionally be applied in such a way that, in particular at the same time, the blocking element 15 also assumes an open position and liquid is transported from the sample chamber 3 into the liquid reservoir 5. For example, a liquid already in the sample chamber may be displaced by the liquid from the liquid reservoir 4, 4-1 or 4-2 and transported into the liquid reservoir 5.

Optionally, if the substrate comprises, for example, at least three liquid reservoirs 4-1, 4-2, and 5, liquid may first be transported from one of the liquid reservoirs 4-1 into the sample chamber as described above, in particular by displacing a liquid already in the sample chamber into the liquid reservoir 5, and subsequently, liquid from the other of the liquid reservoirs 4-2 can be transported into the sample chamber and displace the liquid located in the sample chamber so that it is transported, for example, into the liquid reservoir 5 or another liquid reservoir, in particular into the liquid reservoir 4-1. Thus, a liquid exchange takes place in the sample chamber. In particular, the fluid initially in the sample chamber may be a first process fluid, the fluid supplied from the liquid reservoir 4-1 may be a purge fluid or buffer fluid, and the fluid supplied from the liquid reservoir 4-2 may be a second process liquid. This can ensure that first and second process liquids are not in the sample chamber at the same time. The exchange of process liquids is thus carried out in a more reliable manner.

While the liquid or liquids are in the sample chamber or being transported through the sample chamber, a sample may be in the sample chamber and optionally an examination of the sample, such as a microscopic inspection through the bottom of the sample chamber, may be performed.

The method may comprise, prior to the steps described above, introducing a sample, in particular directly through the openings 22 or 23, into the sample chamber and/or introducing the liquid or liquids into the liquid reservoirs and/or into the sample chamber. The method may comprise, after the sample and optionally a liquid have been introduced into the sample chamber, closing the sample chamber to the outside, for example by means of a lid 22a, 23a or a plug 39. Alternatively or additionally, the method may comprise, optionally after filling liquid into the respective liquid reservoir, closing the liquid reservoirs so that they are only open to the outside via the connections. The method may also comprise connecting to the connections the pump system.

The method may comprise not introducing any more liquid into the sample chamber after the sample chamber has been sealed, in particular at least until the liquid filled into the liquid reservoir 4 or 4-1 or 4-2 prior to sealing has been transported from the liquid reservoir 4 or one or both of the liquid reservoirs 4-1 and 4-2 into the sample chamber. In particular, the method may comprise not introducing fluid into the substrate after the sample chamber has been sealed until fluid has been transported into the sample chamber from all liquid reservoirs into which fluid was introduced prior to sealing.

It will be understood that features specified in the above described embodiments are not restricted to these special combinations and are also possible in any other combinations.

What is claimed is:

1. A substrate for testing samples, in particular cells or molecules, wherein the substrate comprises;
    a fluid system comprising:
        a sample chamber configured in the substrate for storing and testing samples;
        a first liquid reservoir and a second liquid reservoir each in fluid communication with the sample chamber;
        a first passive blocking element and a second passive blocking element that can each assume a closed position and an open position, wherein in the closed position a fluid exchange between the sample chamber and at least one of the first liquid reservoir or the second liquid reservoir is blocked; and
        at least two first fluid channels and at least two second fluid channels which are directly in fluid communication with the sample chamber;
    wherein one of the first fluid channels is part of the first liquid reservoir or is directly in fluid communication therewith and is directly adjacent to one of the second fluid channels, and the first passive blocking element is arranged therebetween;
    wherein another of said first fluid channels is part of or directly in fluid communication with said second liquid reservoir and is directly adjacent to another of said second fluid channels, and said second passive blocking element is arranged therebetween.

2. The substrate according to claim 1, wherein the first passive blocking element is configured in such a way that it assumes the closed position or the open position depending on pressure conditions in the fluid system.

3. The substrate according to claim 1, wherein no active components are arranged in the substrate, in particular no active valves and/or pumps.

4. The substrate according to claim 1,
    wherein the first liquid reservoir is lockable in such a way that it has no direct connection to the outside, in particular, is completely closed to the outside, and/or wherein the sample chamber is lockable in such a way that it has no direct connection to the outside, in particular, is completely closed to the outside.

5. The substrate according to claim 1, wherein the substrate is configured such that the first passive blocking element and the second passive blocking element assume the closed position or the open position independently of one another.

6. The substrate according to claim 1,
    wherein in the closed position of the first passive blocking element and the second passive blocking element, a liquid exchange between the sample chamber and the first liquid reservoir or the second liquid reservoir is blocked and/or a liquid exchange between the first liquid reservoir and the second liquid reservoir is blocked, respectively.

7. The substrate according to claim 1,
    wherein at least one of the at least two first fluid channels is directly adjacent to at least one of the at least two second fluid channels and the first passive blocking element is arranged between the at least one first fluid channel and the at least one second fluid channel.

8. A system comprising the substrate according to claim 1, wherein the system comprises a pump system adapted to be connected to the substrate, in particular comprising at least one pump, and wherein the system optionally comprises a controller for controlling the pump system.

9. The substrate of claim 1, wherein at least one of:
    a) the first passive blocking element has only one direction of passage from the first liquid reservoir into the sample chamber and the second passive blocking element has only one direction of passage from the sample chamber towards the second liquid reservoir; or
    b) the first passive blocking element is arranged above the first fluid channel adjacent to the first passive blocking element and below the second fluid channel adjacent to the first passive blocking element and/or the second passive blocking element is arranged below the first fluid channel adjacent to the second passive blocking element and above the second fluid channel adjacent to the second passive blocking element.

10. The substrate of claim 4, wherein the entire fluid system is lockable in such a way that it has no direct connection to the outside, in particular, is completely closed to the outside.

11. The substrate of claim 6, wherein the substrate is configured in such a way that the first passive blocking element and the second passive blocking element assume the closed position or the open position independently of one another.

12. The substrate of claim 7, wherein the fluid system comprises at least a first sample chamber and a second sample chamber, wherein the at least one first fluid channel is connected to the first sample chamber via one of the at least two second fluid channels and to the second sample chamber via another of the at least two second fluid channels.

13. A substrate for testing samples, in particular cells or molecules, wherein the substrate comprises:
a fluid system comprising:
a sample chamber configured in the substrate for storing and testing samples;
at least one liquid reservoir in fluid communication with the sample chamber;
a first fluid channel that is part of or directly in fluid communication with the liquid reservoir;
a second fluid channel that is directly in fluid communication with the sample chamber, wherein the first fluid channel is directly adjacent to the second fluid channel; and
at least one passive blocking element arranged between the first fluid channel and the second fluid channel that can assume a closed position and an open position, wherein in the closed position a fluid exchange between the sample chamber and the at least one liquid reservoir is blocked;
wherein the first fluid channel and the second fluid channel, in a region in which the first fluid channel is directly adjacent to the second fluid channel, are arranged overlapping each other in a top view of the substrate, and the first fluid channel is arranged above or below the second fluid channel.

14. The substrate of claim 13, further comprising:
at least two first fluid channels and at least two second fluid channels, wherein each one of the at least two first fluid channels is adjacent to one of the at least two second fluid channels and wherein one of the at least two first fluid channels is arranged below one of the at least two second fluid channels adjacent thereto and the other of the at least two first fluid channels is arranged above another of the at least two second fluid channels adjacent thereto.

15. The substrate of claim 13, wherein the fluid system comprises at least a first sample chamber and a second sample chamber and at least two second fluid channels, wherein the first fluid channel is connected to the first sample chamber via one of the at least two second fluid channels and to the second sample chamber via another of the at least two second fluid channels.

16. A substrate for testing samples, in particular cells or molecules, wherein the substrate comprises:
a fluid system comprising a sample chamber configured in the substrate for storing and testing samples and a liquid reservoir in fluid communication with the sample chamber;
at least one passive blocking element that can assume a closed position and an open position, wherein in the closed position a fluid exchange between the sample chamber and the liquid reservoir is blocked; and
at least one connection, wherein the substrate is configured such that gas can enter, in particular be pumped, into the liquid reservoir via the at least one connection.

17. The substrate of claim 16, further comprising:
at least a first connection and a second connection, wherein the substrate is configured in such a way that gas can enter, in particular be pumped, into one of the liquid reservoirs via the first connection and gas can enter, in particular be pumped, into another of the liquid reservoirs via the second connection.

18. A substrate for testing samples, in particular cells or molecules, wherein the substrate comprises:
a fluid system comprising a sample chamber configured in the substrate for storing and testing samples and at least one liquid reservoir in fluid communication with the sample chamber;
at least one passive blocking element that can assume a closed position and an open position, wherein in the closed position a fluid exchange between the sample chamber and the at least one liquid reservoir is blocked; and
a displacement member comprising a chamber having no fluidic communication with the liquid reservoir and at least one connection;
wherein the displacement member is configured in such a way that pumping gas and/or liquid into the chamber increases a volume of the chamber; and
wherein the substrate is formed and arranged in such a way that gas and/or liquid can be pumped into the chamber via the connection and that a volume of the liquid reservoir is reduced when a volume of the chamber is increased by pumping gas and/or liquid into the chamber.

* * * * *